(12) United States Patent
Kimura et al.

(10) Patent No.: US 9,455,134 B2
(45) Date of Patent: Sep. 27, 2016

(54) SUBSTRATE PROCESSING METHOD

(71) Applicant: SCREEN Holdings Co., Ltd., Kyoto (JP)

(72) Inventors: Masahiro Kimura, Kyoto (JP);
Tomonori Kojimaru, Kyoto (JP);
Tetsuya Emoto, Kyoto (JP); Manabu Okutani, Kyoto (JP); Masayuki Otsuji, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 14/639,423

(22) Filed: Mar. 5, 2015

(65) Prior Publication Data
US 2015/0179431 A1 Jun. 25, 2015

Related U.S. Application Data

(60) Continuation of application No. 14/300,354, filed on Jun. 10, 2014, now Pat. No. 9,005,703, which is a division of application No. 13/212,716, filed on Aug. 18, 2011, now Pat. No. 8,821,974.

(30) Foreign Application Priority Data

Aug. 20, 2010 (JP) .................. 2010-185415
Mar. 29, 2011 (JP) .................. 2011-071590
Apr. 27, 2011 (JP) .................. 2011-099529

(51) Int. Cl.
*H01L 21/02* (2006.01)
*H01L 21/306* (2006.01)
*H01L 21/3105* (2006.01)
(Continued)

(52) U.S. Cl.
CPC .......... *H01L 21/02057* (2013.01); *B08B 3/08* (2013.01); *F26B 1/00* (2013.01); *H01L 21/02068* (2013.01); *H01L 21/306* (2013.01); *H01L 21/3105* (2013.01); *H01L 21/321* (2013.01); *H01L 21/6708* (2013.01);
(Continued)

(58) Field of Classification Search
None
See application file for complete search history.

(56) References Cited

U.S. PATENT DOCUMENTS

| 5,391,325 A | 2/1995 | Swenson et al. ............. 510/513 |
| 5,401,611 A | 3/1995 | Edwards et al. ........... 430/276.1 |

(Continued)

FOREIGN PATENT DOCUMENTS

| CN | 101075553 A | 11/2007 |
| CN | 100418185 | 9/2008 |

(Continued)

OTHER PUBLICATIONS

Wang, Hao, et al., "Fabrication and anti-frosting performance of super hydrophobic coating based on modified nano-sized calcium carbonate and ordinary polyacrylate". Applied Surface Science 253 (2007) 8818-8824.

(Continued)

*Primary Examiner* — Joseph Miller, Jr.
(74) *Attorney, Agent, or Firm* — Ostrolenk Faber LLP

(57) ABSTRACT

A hydrophobizing agent vapor is supplied to a substrate and a surface of the substrate including a pattern is hydrophobized. Thereafter, the substrate is dried by vaporizing the hydrophobizing agent. The substrate to be processed is maintained in a state of not contacting water until it is dried after being hydrophobized. Collapse of a pattern formed on the substrate surface is thereby suppressed or prevented.

3 Claims, 18 Drawing Sheets

(51) Int. Cl.
  *H01L 21/321* (2006.01)
  *H01L 21/67* (2006.01)
  *B08B 3/08* (2006.01)
  *H05K 3/22* (2006.01)
  *F26B 1/00* (2006.01)

(52) U.S. Cl.
  CPC ... *H01L21/67028* (2013.01); *H01L 21/67051* (2013.01); *H05K 3/227* (2013.01)

(56) References Cited

U.S. PATENT DOCUMENTS

| | | | |
|---|---|---|---|
| 5,541,034 A | 7/1996 | Leenders et al. | 430/203 |
| 6,140,254 A | 10/2000 | Endisch et al. | 438/787 |
| 6,395,331 B1 | 5/2002 | Yan et al. | 427/169 |
| 6,620,260 B2 | 9/2003 | Kumagai et al. | 134/26 |
| 7,749,909 B2 | 7/2010 | Tomita et al. | 438/694 |
| 7,838,425 B2 | 11/2010 | Tomita et al. | 438/690 |
| 8,168,227 B2 | 5/2012 | Abe et al. | 424/490 |
| 8,491,803 B2 | 7/2013 | McAvoy et al. | 216/27 |
| 8,691,497 B2 | 4/2014 | Inatomi et al. | 430/331 |
| 8,821,974 B2 | 9/2014 | Kimura et al. | 427/248.1 |
| 2001/0017402 A1* | 8/2001 | Usami | H01L 21/76801 257/642 |
| 2002/0037371 A1 | 3/2002 | Kumagai et al. | 427/430.1 |
| 2003/0130147 A1* | 7/2003 | Koito | C11D 3/0073 510/175 |
| 2003/0162683 A1 | 8/2003 | Nagy et al. | 510/407 |
| 2004/0105936 A1 | 6/2004 | Muraoka et al. | 427/372.2 |
| 2004/0208792 A1 | 10/2004 | Linton et al. | 422/99 |
| 2005/0008839 A1 | 1/2005 | Cramer et al. | 428/221 |
| 2005/0032293 A1* | 2/2005 | Clark | H01L 21/02063 438/222 |
| 2005/0079705 A1 | 4/2005 | Takeuchi | 438/637 |
| 2006/0057209 A1 | 3/2006 | Chapman et al. | 424/486 |
| 2007/0082491 A1 | 4/2007 | Uozumi et al. | 438/692 |
| 2007/0190462 A1 | 8/2007 | Shiobara et al. | 430/311 |
| 2007/0267047 A1 | 11/2007 | Hori et al. | 134/33 |
| 2007/0289611 A1 | 12/2007 | Hayashi | 134/26 |
| 2008/0008973 A1 | 1/2008 | Goto et al. | 430/432 |
| 2008/0107864 A1 | 5/2008 | Zhang et al. | 428/141 |
| 2008/0221009 A1 | 9/2008 | Kanagasabapathy et al. | 510/406 |
| 2008/0241489 A1 | 10/2008 | Ishibashi et al. | 428/199 |
| 2009/0001046 A1 | 1/2009 | Kubota et al. | 216/13 |
| 2009/0311874 A1 | 12/2009 | Tomita et al. | 438/759 |
| 2010/0075504 A1 | 3/2010 | Tomita et al. | 438/706 |
| 2010/0122711 A1 | 5/2010 | Ryan | 134/2 |
| 2010/0240219 A1 | 9/2010 | Tomita et al. | 438/706 |
| 2010/0310774 A1 | 12/2010 | Wu et al. | 427/331 |
| 2010/0317780 A1 | 12/2010 | Cheng et al. | 524/269 |
| 2010/0330283 A1 | 12/2010 | Nakamori et al. | 427/299 |
| 2011/0143541 A1 | 6/2011 | Ogawa et al. | 438/694 |
| 2011/0155181 A1 | 6/2011 | Inatomi | 134/30 |
| 2011/0195190 A1 | 8/2011 | Koshiyama et al. | 427/284 |
| 2012/0067908 A1 | 3/2012 | Brown | 220/660 |
| 2013/0089670 A1 | 4/2013 | Su et al. | 427/372.2 |

FOREIGN PATENT DOCUMENTS

| | | |
|---|---|---|
| JP | 7-142349 | 6/1995 |
| JP | 07-335603 | 12/1995 |
| JP | 08-202050 | 8/1996 |
| JP | 2002-50600 | 2/2002 |
| JP | 2003-109897 | 4/2003 |
| JP | 2003-282698 | 10/2003 |
| JP | 2004-078217 | 3/2004 |
| JP | 2007-035705 | 2/2007 |
| JP | 2007-134690 | 5/2007 |
| JP | 2007-227467 | 9/2007 |
| JP | 2008-016780 | 1/2008 |
| JP | 2008-518460 | 5/2008 |
| JP | 2008-205490 | 9/2008 |
| JP | 2008-277748 | 11/2008 |
| JP | 2009-10043 | 1/2009 |
| JP | 2009-212408 | 9/2009 |
| JP | 2009-540581 | 11/2009 |
| JP | 4403202 | 11/2009 |
| JP | 2010-114414 | 5/2010 |
| JP | 2010-129932 | 6/2010 |
| JP | 2011-9537 | 1/2011 |
| JP | 2011-124410 | 6/2011 |
| JP | 2011-135002 | 7/2011 |
| TW | 200739675 | 1/2007 |
| TW | 200807539 | 6/2007 |
| WO | WO 2006/049595 A1 | 5/2006 |
| WO | WO 2007/146848 A2 | 12/2007 |

OTHER PUBLICATIONS

2008 R&D 100 Award Entry Form—"Superhydrophobic Coating", Sandia National Laboratories, pp. 1-27.

Garcia, Beatriz et al., "Mussel-inspired hydrophobic coatings for water-repellent textiles and oil removal". ACS Applied Materials & Interfaces, pp. 1-38. No date available.

Subdedi, Shaphal, et al., "Characterizing Time-Dependent Contact Angles for Sands Hydrophobized with Oleic and Stearic Acids". Soil Science Society of America, Vadose Zone Journal, Jun. 3, 2011, pp. 1-10.

* cited by examiner

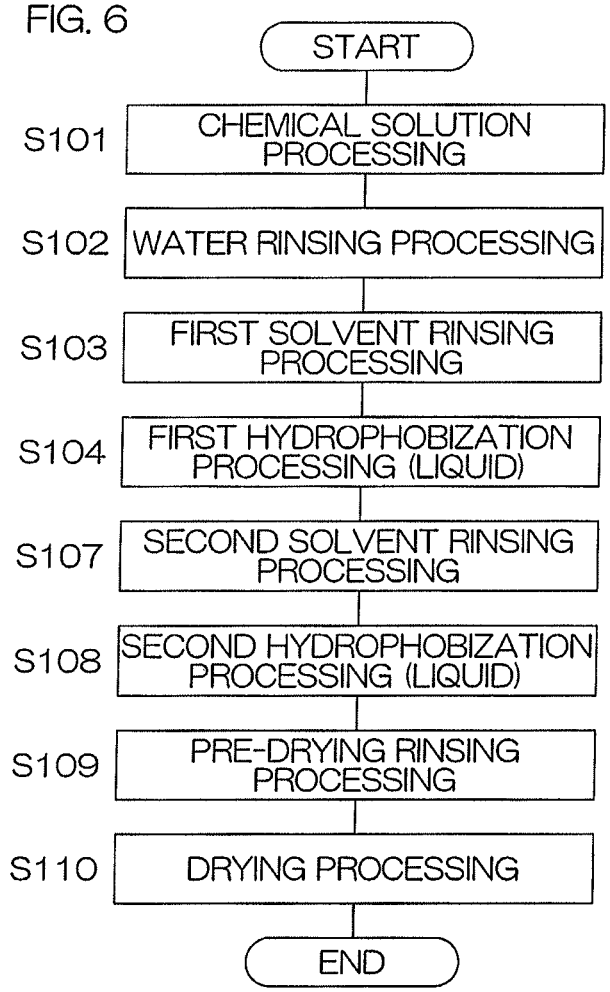
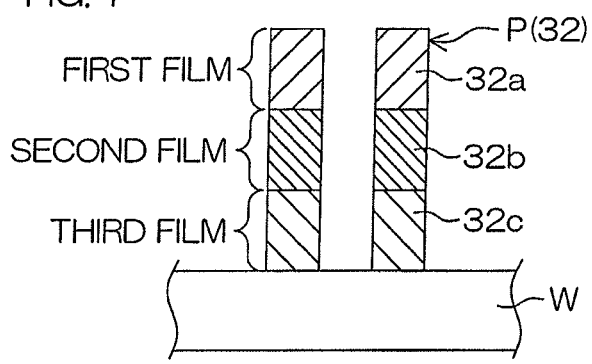

FIG. 8

FIRST FILM  SILICON-CONTAINING FILM
SECOND FILM  SILICON-CONTAINING FILM
THIRD FILM  METAL FILM

|  | FIRST PROCESSING EXAMPLE | SECOND PROCESSING EXAMPLE |
|---|---|---|
| FIRST HYDROPHOBIZING AGENT | SILICON OR METAL | METAL HYDROPHOBIZING AGENT |
| SECOND HYDROPHOBIZING AGENT |  | SILICON HYDROPHOBIZING AGENT |

FIG. 9

FIRST FILM  SiN FILM
SECOND FILM  BSG FILM
THIRD FILM  POLYSILICON FILM

|  | FIRST PROCESSING EXAMPLE | SECOND PROCESSING EXAMPLE |
|---|---|---|
| FIRST HYDROPHOBIZING AGENT | SILICON HYDROPHOBIZING AGENT | SILICON HYDROPHOBIZING AGENT I |
| SECOND HYDROPHOBIZING AGENT |  | SILICON HYDROPHOBIZING AGENT II |

FIG. 10

FIRST FILM  SiN FILM
SECOND FILM  METAL FILM
THIRD FILM  ARBITRARY FILM

|  | FIRST PROCESSING EXAMPLE | SECOND PROCESSING EXAMPLE |
|---|---|---|
| FIRST HYDROPHOBIZING AGENT | SILICON OR METAL | METAL HYDROPHOBIZING AGENT |
| SECOND HYDROPHOBIZING AGENT |  | SILICON HYDROPHOBIZING AGENT |

CONTACT ANGLES AFTER SUPPLYING A SILICON HYDROPHOBIZING AGENT

CONTACT ANGLES AFTER SUPPLYING A METAL HYDROPHOBIZING AGENT

SUBSTRATE PROCESSING METHOD

CROSS-REFERENCE TO RELATED APPLICATIONS

This application is a continuation of U.S. patent application Ser. No. 14/300,354, filed Jun. 10, 2014, which is a divisional of U.S. patent application Ser. No. 13/212,716, filed Aug. 18, 2011, now U.S. Pat. No. 8,821,974, issued Sep. 2, 2014, which claims the benefit of Japanese Patent Application No. 2010-185415, filed Aug. 20, 2010, Japanese Patent Application No. 2011-099529, filed Apr. 27, 2011, and Japanese Patent Application No. 2011-071590, filed Mar. 29, 2011, incorporated herein by reference.

BACKGROUND OF THE INVENTION

1. Field of the Invention

This invention relates to a substrate processing method and a substrate processing apparatus for processing a substrate. Examples of substrates to be processed include semiconductor wafers, substrates for liquid crystal displays, substrates for plasma displays, substrates for FEDs (Field Emission Displays), substrates for optical disks, substrates for magnetic disks, substrates for magneto-optical disks, substrates for photomasks, ceramic substrates, and substrates for solar cells.

2. Description of Related Art

In a production process for a semiconductor device or a liquid crystal display, a substrate, such as a semiconductor wafer or a glass substrate for a liquid crystal display, is processed, for example, one by one. Specifically, a chemical solution is supplied to the substrate and a surface of the substrate is processed by the chemical solution. Thereafter, pure water is supplied and the chemical solution adhering to the substrate is rinsed off. After the chemical solution has been rinsed off, IPA (isopropyl alcohol), which is lower in boiling point than water, is supplied to the substrate and the pure water adhering to the substrate is replaced by IPA. Thereafter, the substrate is rotated at high speed to remove the IPA adhering to the substrate from the substrate and the substrate is thereby dried.

However, with such a substrate processing method, a pattern formed on the surface of the substrate may collapse during drying of the substrate. U.S. Patent Application Publication No. 2010/0240219 A1 thus discloses a method in which drying is performed after hydrophobizing the surface of the substrate to prevent pattern collapse. Specifically, a hydrophobizing agent is supplied to the substrate to hydrophobize the surface of the substrate. Thereafter, IPA is supplied to the substrate and the hydrophobizing agent adhering to the substrate is replaced by IPA. After replacement of the hydrophobizing agent by IPA, pure water is supplied to the substrate and the IPA adhering to the substrate is replaced by pure water. Thereafter, the substrate is rotated at high speed to dry the substrate.

SUMMARY OF THE INVENTION

Pattern collapse can be prevented if the surface of the substrate is sufficiently hydrophobized. However, pattern collapse cannot be prevented if the surface of the substrate is not sufficiently hydrophobized. That is, in a case where the surface of the substrate is only partially hydrophobized or in a case where a contact angle of a processing liquid with respect to the substrate is not sufficiently large, pattern collapse cannot be prevented even if the substrate is dried after being hydrophobized.

When, as in the substrate processing method described in U.S. Patent Application Publication No. 2010/0240219 A1, a single type of hydrophobizing agent is supplied to the substrate, the surface of the substrate may not be hydrophobized sufficiently. Also, when a surface tension of the processing liquid adhering to the substrate is high, a large force is applied to the pattern during drying of the substrate. With the substrate processing method described in U.S. Patent Application Publication No. 2010/0240219 A1, the substrate with pure water adhering thereto is dried. However, the surface tension of pure water is high and thus even if the substrate is hydrophobized, pattern collapse cannot be prevented sufficiently.

Meanwhile, even when a silylating agent is supplied as a hydrophobizing agent to a substrate having a metal film formed thereon, the metal film is not hydrophobized and thus the substrate cannot be hydrophobized sufficiently. However, if a metal hydrophobizing agent that hydrophobizes the metal is supplied to the substrate, the metal film can be hydrophobized even in the case where the metal film is formed on the substrate. However, research by the present inventor has shown that even when a metal hydrophobizing agent is used, there are cases where the substrate cannot be hydrophobized sufficiently.

Specifically, a metal hydrophobizing agent is not stable by itself and another solvent (diluting solvent) must be mixed with the metal hydrophobizing agent. However, when a solvent containing a hydroxyl group is mixed with the metal hydrophobizing agent, an ability (ability to hydrophobize the substrate) of the metal hydrophobizing agent is lowered. That is, in a case where a solvent containing a hydroxyl group is mixed with the metal hydrophobizing agent or in a case where the metal hydrophobizing agent is supplied to a substrate holding a solvent containing a hydroxyl group, the metal hydrophobizing agent cannot exhibits its ability sufficiently.

Further, even when a substrate is hydrophobized by a metal hydrophobizing agent, if after the metal hydrophobizing agent is supplied, a liquid or a vapor that contains water is supplied to the substrate, the contact angle of the processing liquid with respect to the substrate decreases. The force applied to the pattern (the force that collapses the pattern) thus increases when the substrate is dried. Further, if the metal hydrophobizing agent is supplied to the surface of the substrate with water being held on the surface of the substrate, the substrate is not hydrophobized sufficiently. That is, the present inventor found that even when a metal hydrophobizing agent is supplied to a substrate on which a metal film is formed, the metal film cannot be hydrophobized sufficiently under the presence of water.

Thus, an object of the present invention is to provide a substrate processing method and a substrate processing apparatus by which pattern collapse can be suppressed or prevented.

One embodiment of the present invention provides a substrate processing method including a hydrophobizing step of supplying a hydrophobizing agent to a substrate to hydrophobize a surface of the substrate, a drying step of drying the substrate after performing the hydrophobizing step, and a step of maintaining the substrate in a state of not contacting water from the end of the hydrophobizing step to the end of the drying step.

The surface of the substrate is a surface of the substrate itself and, in a case where a pattern is formed on the surface of the substrate, includes a surface of the pattern.

By this method, the hydrophobizing agent is supplied to the substrate and the surface of the substrate is thereby hydrophobized. Thereafter, the substrate is dried. The substrate to be processed is maintained in the state of not contacting water until it is dried after being hydrophobized. Significant decrease in hydrophobicity of the substrate due to contact with water after the hydrophobizing agent is supplied to the substrate can thus be prevented. Pattern collapse can thereby be suppressed or prevented.

The substrate to be processed may be a substrate that includes a metal film or may be a substrate that does not include a metal film.

In a case where the substrate to be processed is a substrate that includes a metal film, the hydrophobizing agent is supplied to the substrate including the metal film and the metal film of the substrate is hydrophobized. Thereafter, the substrate is dried. The substrate to be processed is maintained in the state of not contacting water until it is dried after being hydrophobized. If water contacts the substrate that has been hydrophobized by the hydrophobizing agent that hydrophobizes the metal film, the hydrophobicity of the substrate may decrease significantly. Thus, even when such a hydrophobizing agent is supplied to the substrate, significant decrease in the hydrophobicity of the substrate can be prevented. Pattern collapse can thereby be suppressed or prevented.

Also, the hydrophobizing step may include a step of supplying a liquid of the hydrophobizing agent to the substrate, and the substrate processing method may further include a pre-drying rinsing step of supplying a solvent, lower in surface tension than water and capable of dissolving the hydrophobizing agent, to the substrate after performing the hydrophobizing step and before performing the drying step.

In this case, the solvent capable of dissolving the hydrophobizing agent is supplied to the substrate after the liquid of the hydrophobizing agent has been supplied to the substrate. The hydrophobizing agent adhering to the substrate is thus replaced by the solvent. The solvent is then removed from the substrate and the substrate is dried. The solvent supplied to the substrate in the pre-drying rinsing step is lower in surface tension than water. Pattern collapse can thus be suppressed or prevented more than in a case where a liquid that contains water is supplied to the substrate in the pre-drying rinsing step.

Also, the hydrophobizing step may include a vapor supply step of supplying a vapor of the hydrophobizing agent to the substrate, and the drying step may include a vaporizing step of vaporizing the hydrophobizing agent adhering to the substrate.

In this case, the vapor of the hydrophobizing agent is supplied to the substrate. A portion of the vapor of the hydrophobizing agent supplied to the substrate changes to liquid droplets and adheres to the substrate. However, the liquid droplets of the hydrophobizing agent vaporize and are removed from the substrate in a short time. The substrate can thus be dried by vaporizing the hydrophobizing agent adhering to the substrate after performing the hydrophobizing step. The substrate can thereby be dried rapidly to shorten the substrate processing time.

Another embodiment of the present invention provides a substrate processing apparatus including a substrate holding unit that holds a substrate, a hydrophobizing agent supply unit that supplies a hydrophobizing agent to the substrate held by the substrate holding unit, a drying unit that dries the substrate, and a controller that performs a hydrophobizing step of controlling the hydrophobizing agent supply unit to supply the hydrophobizing agent to the substrate held by the substrate holding unit to thereby hydrophobize a surface of the substrate, a drying step of controlling the drying unit to dry the substrate after performing the hydrophobizing step, and a step of maintaining the substrate in a state of not contacting water from the end of the hydrophobizing step to the end of the drying step. By this arrangement, the same effects as the effects described above can be exhibited.

The substrate processing apparatus may further include a solvent supply unit that supplies a solvent, lower in surface tension than water and capable of dissolving the hydrophobizing agent, to the substrate held by the substrate holding unit, and the hydrophobizing agent supply unit may include a unit that supplies a liquid of the hydrophobizing agent to the substrate held by the substrate holding unit. The controller may perform the hydrophobizing step that includes a step of controlling the hydrophobizing agent supply unit to supply the liquid of the hydrophobizing agent to the substrate held by the substrate holding unit and perform a pre-drying rinsing step of controlling the solvent supply unit to supply the solvent to the substrate held by the substrate holding unit after performing the hydrophobizing step and before performing the drying step. In this case, the same effects as the effects described above can be exhibited.

The hydrophobizing agent supply unit may further include a unit that supplies a vapor of the hydrophobizing agent to the substrate held by the substrate holding unit. The controller may perform the hydrophobizing step that includes a vapor supply step of controlling the hydrophobizing agent supply unit to supply the vapor of the hydrophobizing agent to the substrate held by the substrate holding unit and performs the drying step that includes a vaporizing step of controlling the drying unit to vaporize the hydrophobizing agent adhering to the substrate held by the substrate holding unit. In this case, the same effects as the effects described above can be exhibited.

Yet another embodiment of the present invention provides a substrate processing method for processing a substrate having a metal film formed thereon, the substrate processing method including a rinsing liquid supply step of supplying a rinsing liquid that contains water to the substrate, a first solvent supply step of supplying a first solvent that does not contain a hydroxyl group to the substrate to replace a liquid held by the substrate by the first solvent after performing the rinsing liquid supply step, and a hydrophobizing agent supply step of supplying a hydrophobizing agent, which contains a second solvent that does not contain a hydroxyl group and which hydrophobizes a metal, to the substrate to replace a liquid held by the substrate by the hydrophobizing agent after performing the first solvent supply step.

The hydrophobizing agent supplied to the substrate may be a liquid of the hydrophobizing agent or may be a vapor of the hydrophobizing agent. Likewise, the first solvent supplied to the substrate may be a liquid of the first solvent or may be a vapor of the first solvent. The vapor of the hydrophobizing agent may be that obtained by gasification of the hydrophobizing agent or may be a mixed fluid containing liquid droplets of the hydrophobizing agent and a carrier gas (for example, nitrogen gas or other inert gas) that carries the liquid droplets. The same applies to the vapor of the first solvent.

By this method, the rinsing liquid that contains water is supplied to the substrate having the metal film formed thereon. Thereafter, the first solvent that does not contain a hydroxyl group is supplied to the substrate, and the liquid (rinsing liquid or liquid containing the rinsing liquid) held by the substrate is replaced by the first solvent. The rinsing liquid is thereby removed from the substrate. Then, after the first solvent has been supplied, the hydrophobizing agent, which contains the second solvent that does not contain a hydroxyl group and which hydrophobizes the metal, is supplied to the substrate. The liquid (liquid of the first solvent) held by the substrate is thereby replaced by the hydrophobizing agent. The liquid held by the substrate when the hydrophobizing agent is supplied to the substrate is the liquid of the first solvent. The first solvent does not contain a hydroxyl group and thus the lowering of the ability (ability to hydrophobize the substrate) of the hydrophobizing agent due to mixing of the hydrophobizing agent and the first solvent can be suppressed or prevented. Further, the hydrophobizing agent contains the second solvent that does not contain a hydroxyl group, and the hydrophobizing agent can thereby be stabilized and the lowering of the ability of the hydrophobizing agent can be suppressed or prevented. Moreover, the rinsing liquid is removed from the substrate by the supply of the first solvent before the hydrophobizing agent is supplied to the substrate and thus the hydrophobizing agent is supplied to the substrate in a state where water does not remain on the substrate or a state where a residual amount of water is extremely low. The substrate can thus be hydrophobized sufficiently. Pattern collapse during drying of the substrate can thus be suppressed or prevented.

The substrate processing method may further include a water-soluble solvent supply step of supplying a water-soluble solvent, higher in solubility in water than the first solvent, to the substrate to replace a liquid held by the substrate by the water-soluble solvent after performing the rinsing liquid supply step and before performing the first solvent supply step. The first solvent may be a solvent that dissolves in water or may be a solvent that does not dissolve in water.

In this case, after the rinsing liquid that contains water has been supplied to the substrate, the water-soluble solvent and the first solvent are successively supplied to the substrate in that order. By supplying the water-soluble solvent to the substrate holding the rinsing liquid, a large portion of the rinsing liquid held by the substrate is rinsed off and removed by the water-soluble solvent. Further, the water-soluble solvent is higher in solubility in water than the first solvent, and thus in the process in which the rinsing liquid is replaced by the water-soluble solvent, a portion of the rinsing liquid held by the substrate dissolves into the water-soluble solvent and is removed from the substrate together with the water-soluble solvent. By then supplying the first solvent to the substrate after supplying the water-soluble solvent, the water-soluble solvent held by the substrate is replaced by the first solvent. Even in a case where the rinsing liquid is contained in the water-soluble solvent held by the substrate, the rinsing liquid is removed from the substrate together with the water-soluble solvent in the process of replacement of the water-soluble solvent by the first solvent. The residual amount of water on the substrate can thereby be reduced. The hydrophobizing agent can thus be supplied to the substrate in a state in which water is not left on the substrate or in a state in which the residual amount of water is extremely low. The substrate can thereby be hydrophobized sufficiently. Pattern collapse can thus be suppressed or prevented.

Also, the first solvent supply step may include a physical replacement step of supplying the substrate with the first solvent with a physical force to replace a liquid held by the substrate by the first solvent.

In this case, the first solvent with the physical force applied thereto is supplied to the substrate. The liquid (rinsing liquid or liquid containing the rinsing liquid) held by the substrate is removed from the substrate by the physical force applied to the first solvent in addition to a force of the first solvent flowing along the substrate. The residual amount of water on the substrate can thereby be reduced. The hydrophobizing agent can thus be supplied to the substrate in a state in which water is not left on the substrate or in a state in which the residual amount of water is extremely low. The substrate can thereby be hydrophobized sufficiently. Pattern collapse can thus be suppressed or prevented.

Also, the first solvent supply step may further include a replacement step of supplying the first solvent to the substrate to replace a liquid held by the substrate by the first solvent before the physical replacement step is performed.

In this case, the first solvent is supplied to the substrate after the rinsing liquid has been supplied to the substrate. Thereafter, the first solvent with the physical force applied thereto is supplied. That is, after the liquid (rinsing liquid or liquid containing the rinsing liquid) held by the substrate has been removed by the first supply of the first solvent, the first solvent with the physical force applied thereto is supplied to the substrate. Thus, even when an extremely small amount of the rinsing liquid remains on the substrate after the first supply of the first solvent, the slightly remaining rinsing liquid can be removed from the substrate by the supply of the first solvent with the physical force applied thereto. The hydrophobizing agent can thus be supplied to the substrate in a state in which water is not left on the substrate or in a state in which the residual amount of water is extremely low. The substrate can thereby be hydrophobized sufficiently. Pattern collapse can thus be suppressed or prevented.

Also, the physical replacement step may include at least one of either a step of supplying the first solvent with vibration to the substrate or a step of making liquid droplets of the first solvent provided with kinetic energy collide with the substrate.

In this case, the liquid (rinsing liquid or liquid containing the rinsing liquid) held by the substrate is removed from the substrate by the vibration of the first solvent and/or the kinetic energy of the first solvent in addition to the force of the first solvent flowing along the substrate. The residual amount of water on the substrate can thereby be reduced. The hydrophobizing agent can thus be supplied to the substrate in a state in which water is not left on the substrate or in a state in which the residual amount of water is extremely low. The substrate can thereby be hydrophobized sufficiently. Pattern collapse can thus be suppressed or prevented.

Also, the substrate processing method may further include a drying step of removing a liquid from the substrate to dry the substrate after performing the hydrophobizing agent supply step and a non-contact state maintaining step of maintaining a state in which the substrate is not in contact with water from the end of the hydrophobizing agent supply step to the end of the drying step.

In this case, the liquid is removed from the substrate after the hydrophobizing agent has been supplied to the substrate. The substrate is thereby dried. The substrate is prevented from contacting water from the end of the supply of the hydrophobizing agent to the end of the drying of the substrate. A liquid or vapor containing water is thus not supplied to the substrate from the end of the supply of the hydrophobizing agent to the end of the drying of the substrate. Reduction of contact angle of the processing liquid with respect to the substrate due to contact with water of the substrate to which the hydrophobizing agent has been supplied can thus be suppressed or prevented. Increase in a force applied to the pattern during drying of the substrate can thereby be suppressed or prevented. Pattern collapse can thus be suppressed or prevented.

Also, the non-contact state maintaining step may include a drying agent supply step of supplying a drying agent that does not contain water and is lower in boiling point than water to the substrate to replace a liquid held by the substrate by the drying agent after performing the hydrophobizing agent supply step and before performing the drying step.

In this case, the drying agent is supplied to the substrate after the hydrophobizing agent has been supplied to the substrate. The liquid held by the substrate is thereby replaced by the drying agent. Thereafter, the drying agent is removed from the substrate and the substrate is dried. The drying agent does not contain water and thus reduction of the contact angle of the processing liquid with respect to the substrate due to the drying agent contacting the substrate to which the hydrophobizing agent has been supplied can be suppressed or prevented. Collapsing of the pattern during drying of the substrate can thereby be suppressed or prevented. Further, the drying agent is lower in boiling point than water and time required for drying can thus be shortened.

Also, the hydrophobizing agent supply step may include a step of mixing the second solvent and a stock solution of the hydrophobizing agent in a flow path of the hydrophobizing agent leading from a hydrophobizing agent tank, storing the stock solution of the hydrophobizing agent to be supplied to the substrate, to the substrate, and a step of supplying the mixed second solvent and stock solution of the hydrophobizing agent to the substrate. "Stock solution of the hydrophobizing agent" refers to a liquid before mixing with the second solvent. That is, the "stock solution of the hydrophobizing agent" may be a liquid that is diluted in advance by a diluent (for example, the second solvent) or may be a mixture of a plurality of liquids.

In this case, the second solvent and the stock solution of the hydrophobizing agent are mixed immediately before being supplied to the substrate. The mixed solution (hydrophobizing agent) of the second solvent and the stock solution of the hydrophobizing agent that are mixed is supplied to the substrate. The second solvent and the stock solution of the hydrophobizing agent are mixed immediately before being supplied to the substrate and thus even in a case where the hydrophobizing agent decreases in activity with the elapse of time due to dilution of the hydrophobizing agent, the hydrophobizing agent that is not decreased in activity or is hardly decreased in activity can be supplied to the substrate. The substrate can thereby be hydrophobized sufficiently. Pattern collapse can thus be suppressed or prevented.

Also, the first solvent and the second solvent may be the same type of solvent.

In this case, the hydrophobizing agent that contains the second solvent is supplied to the substrate holding the first solvent that is the solvent of the same type as the second solvent. The first solvent and the hydrophobizing agent thus mix together smoothly and the first solvent held by the substrate is smoothly replaced by the hydrophobizing agent. The time required for replacement from the first solvent to the hydrophobizing agent can thereby be shortened.

Also, a recess portion having a bottomed cylindrical shape may be formed on the substrate. The recess portion may, for example, be a cylinder that forms an electrode of a capacitor provided in a DRAM (dynamic random access memory) or a via hole for connection between wiring layers.

In this case, the rinsing liquid is supplied to the substrate with the recess portion formed thereon. The recess portion has the bottomed cylindrical shape and the rinsing liquid thus readily remains at a bottom of the recess portion. Thus, by supplying the first solvent, etc., to the substrate before supplying the hydrophobizing agent to the substrate, the rinsing liquid remaining at the bottom of the recess portion can be removed and the hydrophobizing agent can thus be supplied to the substrate in a state in which water is not left on the substrate or in a state in which the residual amount of water is extremely low. The substrate can thereby be hydrophobized sufficiently. Pattern collapse can thus be suppressed or prevented.

Yet another embodiment of the present invention provides a substrate processing apparatus including a substrate holding unit that holds a substrate, a rinsing liquid supply unit that supplies a rinsing liquid that contains water to the substrate held by the substrate holding unit, a first solvent supply unit that supplies a first solvent that does not contain a hydroxyl group to the substrate held by the substrate holding unit, a hydrophobizing agent supply unit that supplies a hydrophobizing agent, which contains a second solvent that does not contain a hydroxyl group and which hydrophobizes a metal, to the substrate held by the substrate holding unit, and a controller that performs a rinsing liquid supply step of controlling the rinsing liquid supply unit to supply the rinsing liquid to the substrate held by the substrate holding unit, a first solvent supply step of controlling the first solvent supply unit to supply the first solvent to the substrate held by the substrate holding unit to replace a liquid held by the substrate by the first solvent after performing the rinsing liquid supply step, and a hydrophobizing agent supply step of controlling the hydrophobizing agent supply unit to supply the hydrophobizing agent to the substrate held by the substrate holding unit to replace a liquid held by the substrate by the hydrophobizing agent after performing the first solvent supply step. In this case, the same effects as the effects described above can be exhibited.

The substrate processing apparatus may further include a water-soluble solvent supply unit that supplies a water-soluble solvent, higher in solubility in water than the first solvent, to the substrate. The controller may further perform a water-soluble solvent supply step of controlling the water-soluble solvent supply unit to supply the water-soluble solvent to the substrate held by the substrate holding unit to replace a liquid held by the substrate by the water-soluble solvent after performing the rinsing liquid supply step and before performing the first solvent supply step. In this case, the same effects as the effects described above can be exhibited.

Also, the substrate processing apparatus may further include a physical force applying unit that applies a physical force to the first solvent to be supplied from the first solvent supply unit to the substrate held by the substrate holding unit. The controller may perform the first solvent supply step that includes a physical replacement step of replacing the liquid held by the substrate by the first solvent by supplying the first solvent with the physical force applied thereto by the physical force applying unit to the substrate held by the substrate holding unit. In this case, the same effects as the effects described above can be exhibited.

Also, the controller may perform the first solvent supply step that further includes a replacement step of controlling the first solvent supply unit to supply the first solvent to the substrate held by the substrate holding unit to replace a liquid held by the substrate by the first solvent before the physical replacement step is performed. In this case, the same effects as the effects described above can be exhibited.

Also, the physical force applying unit may include at least one of either a vibration applying unit that applies vibration to the first solvent to be supplied from the first solvent supply unit to the substrate held by the substrate holding unit or a liquid droplet forming unit that applies kinetic energy to the first solvent to be supplied from the first solvent supply unit to the substrate held by the substrate holding unit to form liquid droplets of the first solvent. In this case, the same effects as the effects described above can be exhibited.

Also, the substrate processing apparatus may further include a drying unit that removes a liquid from the substrate held by the substrate holding unit to dry the substrate and a non-contact state maintaining unit that maintains a state in which the substrate held by the substrate holding unit is not in contact with water. The controller may further perform a drying step of controlling the drying unit to remove the liquid from the substrate held by the substrate holding unit to dry the substrate after performing the hydrophobizing agent supply step and a non-contact state maintaining step of controlling the non-contact state maintaining unit to maintain the state in which the substrate is not in contact with water from the end of the hydrophobizing agent supply step to the end of the drying step. In this case, the same effects as the effects described above can be exhibited.

Also, the non-contact state maintaining unit may include a drying agent supply unit that supplies a drying agent that does not contain water and is lower in boiling point than water to the substrate. The controller may perform the non-contact state maintaining step that includes a drying agent supply step of controlling the drying agent supply unit to supply the drying agent to the substrate held by the substrate holding unit to replace a liquid held by the substrate by the drying agent after performing the hydrophobizing agent supply step and before performing the drying step. In this case, the same effects as the effects described above can be exhibited.

Also, the hydrophobizing agent supply unit may include a hydrophobizing agent tank that stores a stock solution of the hydrophobizing agent to be supplied to the substrate held by the substrate holding unit, and a second solvent tank that stores a second solvent to be supplied to a flow path of the hydrophobizing agent leading from the hydrophobizing agent tank to the substrate held by the substrate holding unit. In this case, the hydrophobizing agent supply unit may be arranged to mix the stock solution of the hydrophobizing agent and the second solvent stored in the flow path to supply the mixed second solvent and stock solution of the hydrophobizing agent to the substrate held by the substrate holding unit. In this case, the same effects as the effects described above can be exhibited.

Yet another embodiment of the present invention provides a substrate processing method including a first hydrophobizing step of supplying a first hydrophobizing agent to a substrate to hydrophobize a surface of the substrate, a second hydrophobizing step of supplying a second hydrophobizing agent that differs from the first hydrophobizing agent to the substrate to hydrophobize the surface of the substrate after performing the first hydrophobizing step, and a drying step of drying the substrate after performing the second hydrophobizing step. The surface of the substrate is a surface of the substrate itself and, in a case where a pattern is formed on the surface of the substrate, includes a surface of the pattern.

By this method, the first hydrophobizing agent is supplied to the substrate and the substrate is thereby hydrophobized. After the first hydrophobizing agent has been supplied to the substrate, the second hydrophobizing agent that differs from the first hydrophobizing agent is supplied to the substrate and the substrate is thereby further hydrophobized. Thereafter, the substrate is dried. The first hydrophobizing agent and the second hydrophobizing agent may be supplied to the substrate in liquid states or may be supplied to the substrate in vapor states.

A plurality of types of hydrophobizing agents are thus supplied to the substrate and thus even in a case of processing a substrate on which a pattern of a laminated film that includes a plurality of films of different types is formed, the entire surface of the substrate can be hydrophobized sufficiently. Further, even in a case where hydrophobicity is not increased sufficiently by one type of hydrophobizing agent, the surface of the substrate can be hydrophobized sufficiently. Pattern collapse can thereby be suppressed or prevented.

The substrate processing method may include a step of maintaining the surface of the substrate in a state of not contacting water from the end of the first hydrophobizing step or the second hydrophobizing step to the end of the drying step.

In this case, the hydrophobized surface of the substrate is maintained in the state of not contacting water until the substrate is dried. When water contacts the substrate that has been hydrophobized by a hydrophobizing agent that hydrophobizes a metal film, the hydrophobicity of the substrate may decrease significantly. Thus, even when such a hydrophobizing agent is supplied to the substrate, significant decrease in the hydrophobicity of the substrate can be prevented. Pattern collapse can thereby be suppressed or prevented.

Also, the substrate processing method may be a method for processing a substrate on which a pattern of a laminated film having a lower layer film and an upper layer film is formed, the first hydrophobizing agent may be a hydrophobizing agent that hydrophobizes the lower layer film, and the second hydrophobizing agent may be a hydrophobizing agent that hydrophobizes the upper layer film.

In this case, after the lower layer film has been hydrophobized by the first hydrophobizing agent or after the lower layer film and the upper layer film have been hydrophobized by the first hydrophobizing agent, the upper layer film is hydrophobized by the second hydrophobizing agent. For example, when a hydrophobizing agent is further supplied to the substrate after the upper layer film has been hydrophobized, the hydrophobizing agent may not be supplied sufficiently to the lower layer film because the upper layer film is hydrophobized. Thus, by supplying the second hydrophobizing agent that hydrophobizes the upper layer film to the substrate after the lower layer film has been hydrophobized or the lower layer film and the upper layer film have been hydrophobized, the upper layer film and the lower layer film can be hydrophobized sufficiently. The substrate can thereby be hydrophobized sufficiently.

Also, the substrate processing method may further include a water rinsing step of supplying a rinsing liquid that contains water to the substrate before the first hydrophobizing step is performed, and a first solvent rinsing step of supplying a first solvent capable of dissolving the rinsing liquid and the first hydrophobizing agent to the substrate after performing the water rinsing step and before performing the first hydrophobizing step.

In this case, the rinsing liquid that contains water is supplied to the substrate. Thereafter, the first solvent capable of dissolving the rinsing liquid and the first hydrophobizing agent is supplied to the substrate. The rinsing liquid adhering to the substrate is thereby replaced by the first solvent. The first hydrophobizing agent and the second hydrophobizing agent are thus supplied to the substrate in a state where the rinsing liquid has been removed. The first hydrophobizing agent and the second hydrophobizing agent are thus prevented from contacting the water contained in the rinsing liquid. Thus, in a case where hydrophobizing agents that decrease in activity upon contact with water are used as the first hydrophobizing agent and the second hydrophobizing agent, decreases in the activities of the first hydrophobizing agent and the second hydrophobizing agent are prevented. The substrate can thereby be hydrophobized sufficiently.

Also, a second solvent rinsing step of supplying a second solvent capable of dissolving the first hydrophobizing agent and the second hydrophobizing agent to the substrate after performing the first hydrophobizing step and before performing the second hydrophobizing step may further be included.

In this case, the second solvent capable of dissolving the first hydrophobizing agent and the second hydrophobizing agent is supplied to the substrate after performing the first hydrophobizing step and before performing the second hydrophobizing step. For example, when, in a case where the first hydrophobizing agent and the second hydrophobizing agent do not readily mix together, the second hydrophobizing agent is supplied to the substrate in a state where the first hydrophobizing agent is adhering to the substrate, the first hydrophobizing agent adhering to the substrate cannot be replaced readily by the second hydrophobizing agent. The second hydrophobizing agent thus does not contact the surface of the substrate sufficiently.

Meanwhile, the second solvent can dissolve the first hydrophobizing agent and the second hydrophobizing agent. Thus, by supplying the second solvent to the substrate after performing the first hydrophobizing step, the first hydrophobizing agent adhering to the substrate can be replaced by the second solvent and the first hydrophobizing agent can thereby be removed from the substrate. Then, by supplying the second hydrophobizing agent to the substrate after performing the second solvent rinsing step, the second solvent adhering to the substrate can be replaced by the second hydrophobizing agent and the second solvent can thus be removed from the substrate. Thus, even in the case where the first hydrophobizing agent and the second hydrophobizing agent do not readily mix together, the first hydrophobizing agent adhering to the substrate can be replaced by the second hydrophobizing agent. The second hydrophobizing agent can thereby be made to react with the substrate and the substrate can be hydrophobized by the second hydrophobizing agent.

Also, the first hydrophobizing step may include a first vapor supply step of supplying a vapor of the first hydrophobizing agent to the substrate, and the second hydrophobizing step may include a second vapor supply step of supplying a vapor of the second hydrophobizing agent to the substrate. The drying step may include a vaporizing step of vaporizing the second hydrophobizing agent adhering to the substrate.

In this case, after the vapor of the first hydrophobizing agent has been supplied to the substrate, the vapor of the second hydrophobizing agent is supplied to the substrate. Portions of the vapors of the first hydrophobizing agent and the second hydrophobizing agent supplied to the substrate change to liquid droplets and adhere to the substrate. However, the liquid droplets of the first hydrophobizing agent and the second hydrophobizing agent vaporize and are thereby removed from the substrate in a short time. The substrate can thus be dried by vaporizing the second hydrophobizing agent adhering to the substrate after performing the second hydrophobizing step. The substrate can thereby be dried rapidly and the substrate processing time can be shortened.

Yet another embodiment of the present invention provides a substrate processing apparatus including a substrate holding unit that holds a substrate, a first hydrophobizing agent supply unit that supplies a first hydrophobizing agent to the substrate held by the substrate holding unit, a second hydrophobizing agent supply unit that supplies a second hydrophobizing agent differing from the first hydrophobizing agent to the substrate held by the substrate holding unit, a drying unit that dries the substrate, and a controller that controls the first hydrophobizing agent supply unit, the second hydrophobizing agent supply unit, and the drying unit to supply the first hydrophobizing agent to the substrate to hydrophobize the surface of the substrate, thereafter supply the second hydrophobizing agent to the substrate to hydrophobize the surface of the substrate, and thereafter dry the substrate. By this arrangement, the same effects as the effects described above can be exhibited.

The foregoing and other objects, features and effects of the present invention will become more apparent from the following detailed description of the preferred embodiments with reference to the attached drawings.

BRIEF DESCRIPTION OF THE DRAWINGS

FIG. 6 is a process chart for describing a second processing example of processing a substrate by the substrate processing apparatus according to the first embodiment of the present invention.

FIG. 7 is a sectional view of an example of a substrate processed by the substrate processing apparatus according to the first embodiment of the present invention.

FIG. 8 is a table for describing hydrophobizing agents used in a case where a first film, a second film, and a third film are a silicon-containing film, a silicon-containing film, and a metal film, respectively.

FIG. 9 is a table for describing hydrophobizing agents used in a case where a first film, a second film, and a third film are an SiN film, a BSG film, and a polysilicon film, respectively.

FIG. 10 is a table for describing hydrophobizing agents used in a case where a first film, a second film, and a third film are an SiN film, a metal film, and an arbitrary film, respectively.

DETAILED DESCRIPTION OF PREFERRED EMBODIMENTS

First Embodiment

Figure 1:
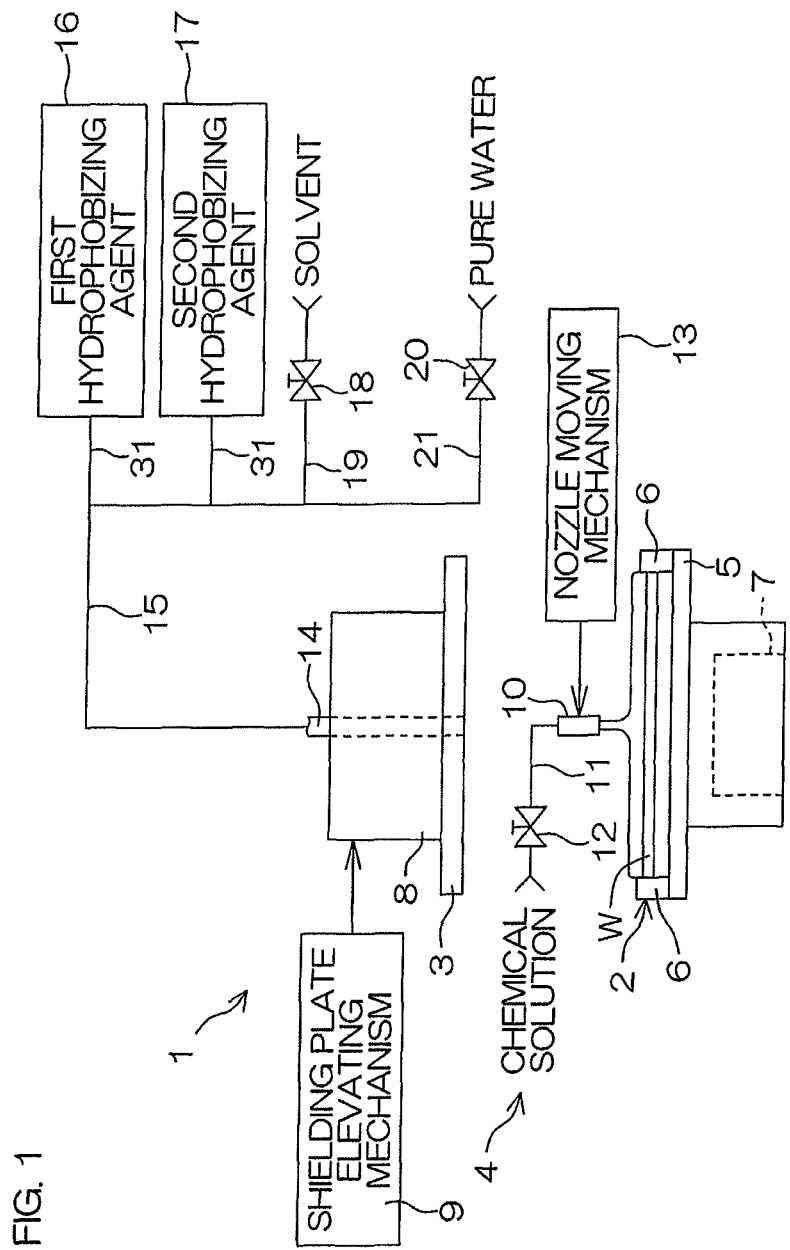
FIG. 1 is a schematic view of a general arrangement of a substrate processing apparatus according to a first embodiment of the present invention.
Figure 2:
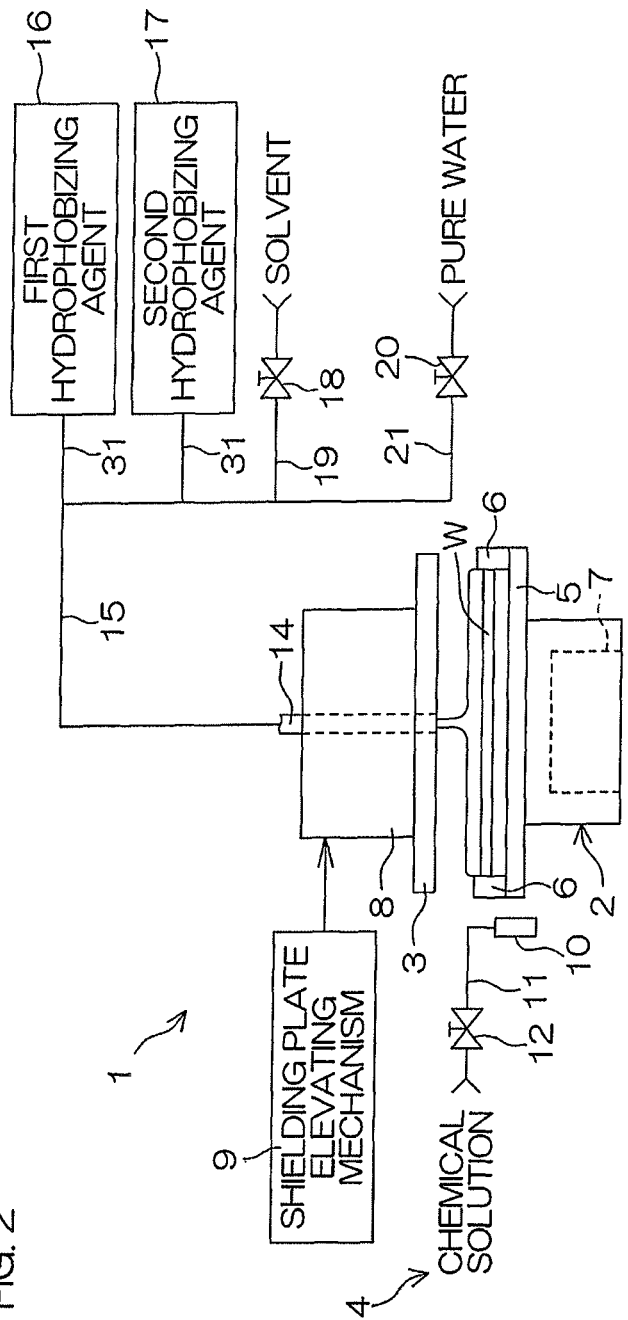
FIG. 2 is a schematic view of the general arrangement of the substrate processing apparatus according to the first embodiment of the present invention.
Figure 3:
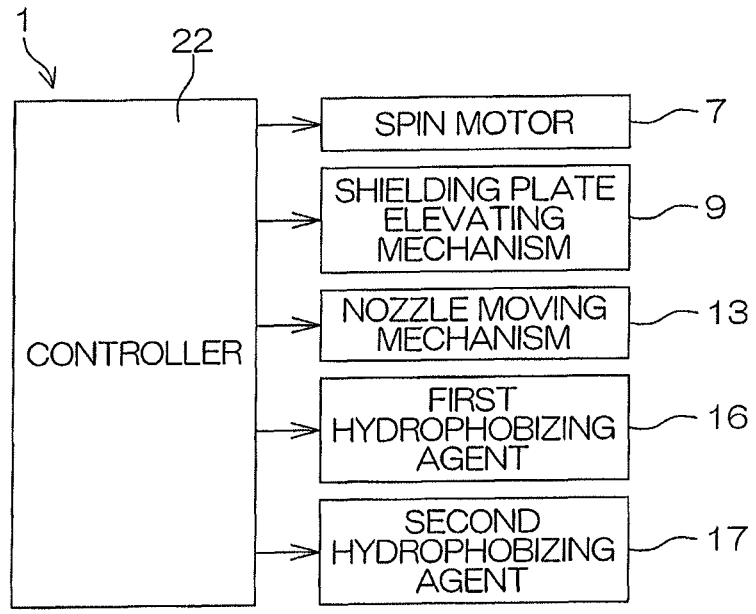
FIG. 3 is a block diagram for describing an electrical arrangement of the substrate processing apparatus according to the first embodiment of the present invention.

Each of FIG. 1 and FIG. 2 is a schematic view of a general arrangement of a substrate processing apparatus 1 according to a first embodiment of the present invention. FIG. 3 is a block diagram for describing an electrical arrangement of the substrate processing apparatus 1 according to the first embodiment of the present invention.

The substrate processing apparatus 1 is a single substrate processing type substrate processing apparatus that processes a semiconductor wafer or other substrate W one at a time by a chemical solution, a rinsing liquid, and other processing liquids. As shown in FIG. 1 and FIG. 2, the substrate processing apparatus 1 includes a spin chuck 2 (substrate holding unit, drying unit) that horizontally holds and rotates the substrate W, a shielding plate 3 disposed above the spin chuck 2, and a processing liquid supply mechanism 4 that supplies the processing liquids to the substrate W held by the spin chuck 2.

The spin chuck 2 is, for example, a gripping type substrate holding unit that grips and holds the substrate W. The spin chuck 2 includes, for example, a disk-shaped spin base 5 that is disposed horizontally, a plurality of gripping members 6 disposed on the spin base 5, and a spin motor 7 coupled to the spin base 5. The spin chuck 2 can grip the substrate W from the periphery by putting the respective gripping members 6 in contact with a peripheral end surface of the substrate W. Further, the spin chuck 2 can rotate the substrate W about a vertical rotational axis passing through a center of the substrate W by transmitting a driving force of the spin motor 7 to the spin base 5 while holding the substrate W. The spin chuck 2 is not restricted to a gripping type substrate holding unit and may be a substrate holding unit of another form, such as a vacuum type that suctions and holds a lower surface (rear surface) of the substrate W.

Also, the shielding plate 3 has, for example, a disk shape. A diameter of the shielding plate 3 is, for example, substantially the same as a diameter of the substrate W or slightly greater than the diameter of the substrate W. The shielding plate 3 is disposed so that a lower surface of the shielding plate 3 is horizontal. Further, the shielding plate 3 is disposed so that a central axis of the shielding plate 3 is positioned along the rotational axis of the spin chuck 2. The lower surface of the shielding plate 3 faces an upper surface of the substrate W held by the spin chuck 2. The shielding plate 3 is coupled in the horizontal posture to a lower end of a support shaft 8. The shielding plate 3 and the support shaft 8 are raised and lowered in a vertical direction by a shielding plate elevating mechanism 9. The shielding plate elevating mechanism 9 raises and lowers the shielding plate 3 between a processing position (position shown in FIG. 2) at which the lower surface of the shielding plate 3 is set close to the upper surface of the substrate W held by the spin chuck 2 and a retreat position (position shown in FIG. 1) set above the processing position.

The processing liquid supply mechanism 4 includes a chemical solution nozzle 10, a chemical solution supply pipe 11, and a chemical solution valve 12. The chemical solution supply pipe 11 is connected to the chemical solution nozzle 10. The chemical solution valve 12 is interposed in the chemical solution supply pipe 11. When the chemical solution valve 12 is opened, a chemical solution is supplied from the chemical solution supply pipe 11 to the chemical solution nozzle 10. Also, when the chemical solution valve 12 is closed, the supply of the chemical solution from the chemical solution supply pipe 11 to the chemical solution nozzle 10 is stopped. The chemical solution nozzle 10 is coupled to a nozzle moving mechanism 13. The nozzle moving mechanism 13 moves the chemical solution nozzle 10 between a processing position (position shown in FIG. 1) set above the spin chuck 2 and a retreat position (position shown in FIG. 2) set at a position away from the processing position. The processing position is set so that the chemical solution discharged from the chemical solution nozzle 10 is supplied to a central portion of the upper surface of the substrate W held by the spin chuck 2 (see FIG. 1).

Also, the processing liquid supply mechanism 4 includes a central axis nozzle 14 and a processing liquid supply pipe 15. The central axis nozzle 14 is disposed along the central axis of the shielding plate 3. The central axis nozzle 14 extends vertically in an interior of the support shaft 8. The central axis nozzle 14 is raised and lowered along with the shielding plate 3 and the support shaft 8. The processing liquid supply pipe 15 is connected to the central axis nozzle 14 above the shielding plate 3. For example, a hydrophobizing agent, a solvent, a rinsing liquid, and other processing liquids are supplied from the processing liquid supply pipe 15 to the central axis nozzle 14. The processing liquid supplied to the central axis nozzle 14 is discharged downward from a lower end of the central axis nozzle 14. The processing liquid discharged from the central axis nozzle 14 passes through a through-hole (not shown) that passes vertically through a central portion of the shielding plate 3 and is discharged downward from a central portion of the lower surface of the shielding plate 3 (see FIG. 2). The processing liquid is thereby supplied to the central portion of the upper surface of the substrate W held by the spin chuck 2.

The processing liquid supply mechanism 4 includes two hydrophobizing agent supply units 16 and 17, a solvent supply pipe 19 having a solvent valve 18 (solvent supply unit) interposed therein, and a rinsing liquid supply pipe 21 having a rinsing liquid valve 20 interposed therein. The processing liquid supply pipe 15 is connected to the respective hydrophobizing agent supply units 16 and 17, the solvent supply pipe 19, and the rinsing liquid supply pipe 21. A first hydrophobizing agent (liquid) is supplied from the first hydrophobizing agent supply unit 16 (hydrophobizing agent supply unit, first hydrophobizing agent supply unit) to the processing liquid supply pipe 15. A second hydrophobizing agent (liquid) is supplied from the second hydrophobizing agent supply unit 17 (hydrophobizing agent supply unit, second hydrophobizing agent supply unit) to the processing liquid supply pipe 15. Also, when the solvent valve 18 is opened, a solvent (liquid) is supplied from the solvent supply pipe 19 to the processing liquid supply pipe 15. Likewise, when the rinsing liquid valve 20 is opened, a rinsing liquid is supplied from the rinsing liquid supply pipe 21 to the processing liquid supply pipe 15.

The rinsing liquid is a liquid that contains water. The rinsing liquid is, for example, any of pure water (deionized water), carbonated water, electrolyzed ion water, hydrogen water, ozone water, or aqueous hydrochloric acid of dilute concentration (for example, about 10 to 100 ppm).

The first hydrophobizing agent and the second hydrophobizing agent are mutually different types of hydrophobizing agents. The first hydrophobizing agent and the second hydrophobizing agent are liquids that do not contain water. The first hydrophobizing agent is, for example, a silicon hydrophobizing agent that hydrophobizes silicon itself or a compound that contains silicon, or a metal hydrophobizing agent that hydrophobizes a metal itself or a compound that contains a metal. The same applies to the second hydrophobizing agent.

The metal hydrophobizing agent contains, for example, at least one of an amine having a hydrophobic group and an organosilicon compound.

The silicon hydrophobizing agent is, for example, a silane coupling agent. The silane coupling agent contains, for example, at least one of HMDS (hexamethyldisilazane), TMS (tetramethylsilane), a fluorinated alkylchlorosilane, an alkyldisilazane, and a nonchloro hydrophobizing agent.

The nonchloro hydrophobizing agent contains, for example, at least one of dimethylsilyldimethylamine, dimethylsilyldiethylamine, hexamethyldisilazane, tetramethyldisilazane, bis(dimethylamino)dimethylsilane, N,N-dimethylaminotrimethylsilane, N-(trimethylsilyl)dimethylamine, and an organosilane compound.

The solvent is a liquid that is capable of dissolving the hydrophobizing agent and water but does not contain water. The solvent contains, for example, at least one of an alcohol, a ketone, PGMEA (propylene glycol monomethyl ether acetate), EGMEA (ethylene glycol monomethyl ether acetate), and a fluorine-based solvent. The solvent is lower in surface tension than water and is lower in boiling point than water.

The alcohol contains, for example, at least one of methyl alcohol, ethanol, propyl alcohol, and IPA (isopropyl alcohol).

The ketone contains, for example, at least one of acetone and diethyl ketone.

The fluorine-based solvent contains, for example, at least one of an HFE (hydrofluoroether) and an HFC (hydrofluorocarbon).

As shown in FIG. 3, the substrate processing apparatus 1 includes a controller 22. The spin motor 7, the shielding plate elevating mechanism 13, and the respective hydrophobizing agent supply units 16 and 17 are controlled by the controller 22. Also, opening and closing of the respective valves included in the substrate processing apparatus 1 are controlled by the controller 22. As shown in FIG. 1, the controller 22 positions the chemical solution nozzle 10 at the processing position and causes the chemical solution to be discharged from the chemical solution nozzle 10 while the substrate W is being rotated by the spin chuck 2. The chemical solution discharged from the chemical solution nozzle 10 is supplied to the central portion of the upper surface of the substrate W held by the spin chuck 2. The chemical solution supplied to the central portion of the upper surface of the substrate W receives a centrifugal force due to rotation of the substrate W and spreads outward along the substrate W. The chemical solution is thereby supplied to an entire upper surface of the substrate W and the substrate W is processed by the chemical solution.

On the other hand, as shown in FIG. 2, the controller 22 positions the shielding plate 3 at the processing position and causes a processing liquid to be discharged from the central axis nozzle 14 while the substrate W is being rotated by the spin chuck 2. The processing liquid discharged from the central axis nozzle 14 is supplied to the central portion of the upper surface of the substrate W held by the spin chuck 2. The processing liquid supplied to the central portion of the upper surface of the substrate W receives the centrifugal force due to rotation of the substrate W and spreads outward along the substrate W. The processing liquid is thereby supplied to the entire upper surface of the substrate W and the substrate W is processed by the processing liquid. Also, the processing liquid that is shaken off to the periphery of the substrate W is suppressed or prevented from splashing back and adhering to the substrate W because the processing liquid is supplied to the substrate W with the lower surface of the shielding plate 3 being set close to the upper surface of the substrate W.

Figure 4:
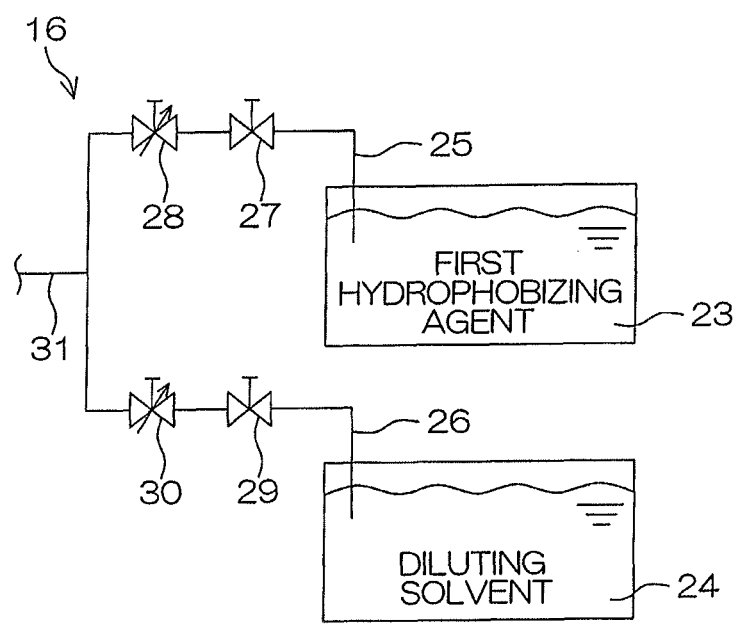
FIG. 4 is a schematic view of a general arrangement of a first hydrophobizing agent supply unit according to the first embodiment of the present invention.

FIG. 4 is a schematic view of a general arrangement of the first hydrophobizing agent supply unit 16 according to the first embodiment of the present invention. In the following description, the general arrangement of the first hydrophobizing agent supply unit 16 shall be described. The general arrangement of the second hydrophobizing agent supply unit 17 is the same as that of the first hydrophobizing agent supply unit 16 and description thereof shall thus be omitted.

The hydrophobizing agent supply unit 16 includes a first tank 23 storing the first hydrophobizing agent (liquid) and a second tank 24 storing a diluting solvent (liquid). Further, the first hydrophobizing agent supply unit 16 includes a first pipe 25 connected to the first tank 23, a second pipe 26 connected to the second tank 24, a first valve 27 and a first flow regulating valve 28 interposed in the first pipe 25, a second valve 29 and a second flow regulating valve 30 interposed in the second pipe 26, and a collective pipe 31 connected to the first pipe 25 and the second pipe 26.

The first hydrophobizing agent stored in the first tank 23 is supplied to the first pipe 25, for example, by being suctioned by a pump or by an air pressure inside the first tank 23 being raised by of a gas supplied into the first tank 23. The same applies to the diluting solvent. The collective pipe 31 is connected to the processing liquid supply pipe 15 (see FIG. 1 and FIG. 2). Also, the opening and closing of the first valve 27 and the second valve 29 are controlled by the controller 22. Also, opening degrees of the first flow regulating valve 28 and the second flow regulating valve 30 are controlled by the controller 22.

When the controller 22 opens the first valve 27, the first hydrophobizing agent stored in the first tank 23 is supplied to the collective pipe 31 at a flow rate in accordance with the opening degree of the first flow regulating valve 28. Likewise, when the controller 22 opens the second valve 29, the diluting solvent stored in the second tank 24 is supplied to the collective pipe 31 at a flow rate in accordance with the opening degree of the second flow regulating valve 30. The first hydrophobizing agent and the diluting solvent are thereby mixed inside the collective pipe 31. The diluting solvent thus dissolves in the first hydrophobizing agent and the first hydrophobizing agent is diluted. The diluted first hydrophobizing agent is supplied from the collective pipe 31 to the processing liquid supply pipe 15 and is discharged from the central axis nozzle 14. The first hydrophobizing agent may be supplied in the diluted state to the central axis nozzle 14 or may be supplied to the central axis nozzle 14 without being diluted. For example, in a case where the first hydrophobizing agent is an organosilicon compound that is an example of a metal hydrophobizing agent, the first hydrophobizing agent is preferably supplied to the central axis nozzle 14 without being diluted.

The diluting solvent is a liquid that can dissolve the hydrophobizing agent, the solvent, and water and yet does not contain water. The diluting solvent contains, for example, at least one of an alcohol (monohydric alcohol), a polyhydric alcohol, a ketone, PGMEA, EGMEA, and a fluorine-based solvent. The diluting solvent is lower in surface tension than water and is lower in boiling point than water.

The alcohol contains, for example, at least one of methyl alcohol, ethanol, propyl alcohol, and IPA.

The polyhydric alcohol contains, for example, ethylene glycol.

The ketone contains, for example, at least one of acetone and diethyl ketone.

The fluorine-based solvent contains, for example, at least one of an HFE and an HFC (hydrofluorocarbon).

In a case where the first hydrophobizing agent is an amine having a hydrophobic group, which is an example of a metal hydrophobizing agent, a hydrophilic solvent is used as the diluting solvent. That is, a monohydric alcohol, such as methyl alcohol, ethanol, IPA, propyl alcohol, etc., a polyhydric alcohol, such as ethylene glycol, etc., or a ketone, such as acetone, diethyl ketone, etc., is used as the diluting solvent.

Figure 5:
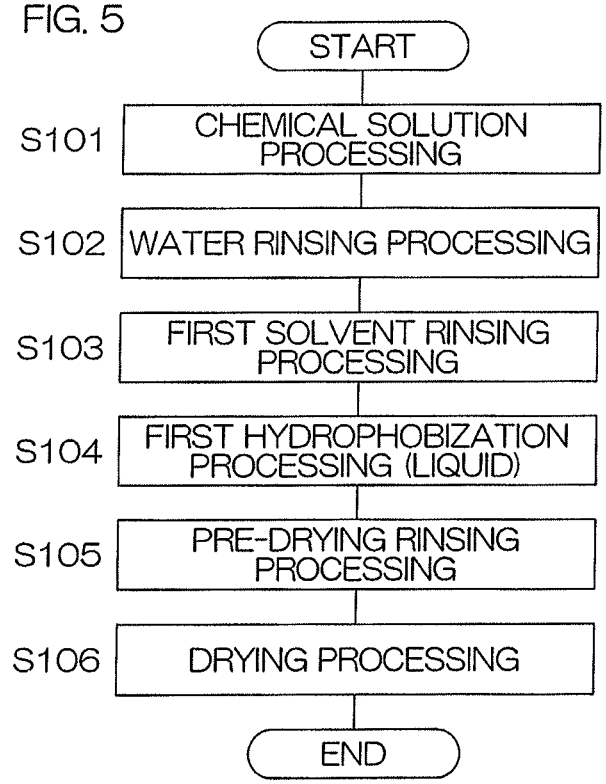
FIG. 5 is a process chart for describing a first processing example of processing a substrate by the substrate processing apparatus according to the first embodiment of the present invention.

FIG. 5 is a process chart for describing a first processing example of processing a substrate W by the substrate processing apparatus 1 according to the first embodiment of the present invention. In the following description, the processing example of processing the substrate W having patterns P (see FIG. 7) formed on a front surface, which is a device forming surface, shall be described with reference to FIG. 1, FIG. 2, and FIG. 5. Also, in the following description, "upper surface (front surface) of the substrate W" includes the upper surface (front surface) of the substrate W itself and surfaces of the patterns P.

An unprocessed substrate W is transferred by an unillustrated transfer robot and is placed on the spin chuck 2, for example, with the front surface that is the device forming surface faced upward. The controller 22 then controls the spin chuck 2 and makes it hold the placed substrate W. When the substrate W is being transferred onto the spin chuck 2, the controller 22 positions the chemical solution nozzle 10 and the shielding plate 3 at the respective retreat positions to prevent the transfer robot and the substrate W from colliding with the chemical solution nozzle 10 and the shielding plate 3.

Thereafter, a chemical solution processing of supplying the chemical solution to the substrate W is performed (S101). Specifically, the controller 22 controls the nozzle moving mechanism 13 to move the chemical solution nozzle 10 from the retreat position to the processing position with the shielding plate 3 being positioned at the retreat position. Also, the controller 22 controls the spin motor 7 to rotate the substrate W held by the spin chuck 2. The controller 22 then causes the chemical solution to be discharged from the chemical solution nozzle 10 toward the central portion of the upper surface of the substrate W while making the substrate W rotate by the spin chuck 2. The chemical solution is thereby supplied to the entire upper surface of the substrate W and the substrate W is processed by the chemical solution (chemical solution processing). Then, when the chemical solution processing has been performed for a predetermined time, the controller 22 closes the chemical solution valve 12 to stop the discharge of the chemical solution. Thereafter, the controller 22 controls the nozzle moving mechanism 13 to move the chemical solution nozzle 10 to the retreat position.

Thereafter, a water rinsing processing (water rinsing step) of supplying pure water, which is an example of a rinsing liquid, to the substrate W is performed (S102). Specifically, the controller 22 controls the shielding plate elevating mechanism 9 to move the shielding plate 3 from the retreat position to the processing position with the chemical solution nozzle 10 being positioned at the retreat position. The controller 22 then opens the rinsing liquid valve 20 to cause pure water to be discharged from the central axis nozzle 14 toward the central portion of the upper surface of the substrate W while making the substrate W rotate by the spin chuck 2. Pure water is thereby supplied to the entire upper surface of the substrate W and the chemical solution adhering to the substrate W is rinsed off by the pure water (water rinsing processing). Then, when the water rinsing processing has been performed for a predetermined time, the controller 22 closes the rinsing liquid valve 20 to stop the discharge of pure water.

Thereafter, a first solvent rinsing processing (first solvent rinsing step) of supplying the solvent to the substrate W is performed (S103). Specifically, the controller 22 opens the solvent valve 18 to cause the solvent to be discharged from the central axis nozzle 14 toward the central portion of the upper surface of the substrate W while positioning the shielding plate 3 at the processing position and further making the substrate W rotate by the spin chuck 2. The solvent discharged from the central axis nozzle 14 is thereby supplied as the first solvent to the entire upper surface of the substrate W. As mentioned above, the solvent is a liquid that can dissolve water and thus the pure water adhering to the substrate W dissolves into the solvent supplied to the substrate W. Thus, by supplying the solvent to the entire upper surface of the substrate W, the pure water adhering to the substrate W is rinsed off by the solvent and is replaced by the solvent (first solvent rinsing processing). Then, when the first solvent rinsing processing has been performed for a predetermined time, the controller 22 closes the solvent valve 18 to stop the discharge of the solvent.

Thereafter, a first hydrophobization processing (hydrophobizing step, first hydrophobizing step) of supplying the first hydrophobizing agent (liquid) to the substrate W is performed (S104). Specifically, the controller 22 controls the first hydrophobizing agent supply unit 16 to cause the first hydrophobizing agent to be discharged from the central axis nozzle 14 toward the central portion of the upper surface of the substrate W while positioning the shielding plate 3 at the processing position and further making the substrate W rotate by the spin chuck 2. The first hydrophobizing agent is thereby supplied to the entire upper surface of the substrate W. As mentioned above, the solvent is a liquid that can dissolve the hydrophobizing agent and thus by supplying the first hydrophobizing agent to the entire upper surface of the substrate W, the solvent adhering to the substrate W is replaced by the first hydrophobizing agent. The first hydrophobizing agent is thereby made to enter into internal portions of the patterns P and the upper surface of the substrate W is thereby hydrophobized (first hydrophobization processing). Then, when the first hydrophobization processing has been performed for a predetermined time, the controller 22 controls the first hydrophobizing agent supply unit 16 to stop the discharge of the first hydrophobizing agent.

Thereafter, a pre-drying rinsing processing (pre-drying rinsing step) of supplying the solvent to the substrate W is performed (S105). Specifically, the controller 22 opens the solvent valve 18 to cause the solvent to be discharged from the central axis nozzle 14 toward the central portion of the upper surface of the substrate W while positioning the shielding plate 3 at the processing position and further making the substrate W rotate by the spin chuck 2. The solvent discharged from the central axis nozzle 14 is thereby supplied to the entire upper surface of the substrate W. The first hydrophobizing agent adhering to the substrate W is thus replaced by the solvent (pre-drying rinsing processing). Then, when the pre-drying rinsing processing has been performed for a predetermined time, the controller 22 closes the solvent valve 18 to stop the discharge of the solvent.

Thereafter, a drying processing (drying step) of drying the substrate W is performed (S106). Specifically, the controller 22 controls the spin motor 7 to rotate the substrate W at a high rotation speed (for example, several thousand rpm) with the shielding plate 3 being positioned at the processing position. A large centrifugal force thus acts on the solvent adhering to the substrate W and the solvent is shaken off to the periphery of the substrate W. The solvent is thereby removed from the substrate W and the substrate W is dried (drying processing). After the drying processing has been performed for a predetermined time, the controller 22 controls the spin motor 7 to stop the rotation of the substrate W by the spin chuck 2. Further, the controller 22 controls the shielding plate elevating mechanism 9 to move the shielding plate 3 from the processing position to the retreat position. Thereafter, the substrate W that has been processed is carried out from the spin chuck 2 by the transfer robot.

FIG. 6 is a process chart for describing a second processing example of processing a substrate W by the substrate processing apparatus 1 according to the first embodiment of the present invention. In the following description, the processing example of processing the substrate W having patterns P formed on the front surface, which is the device forming surface, shall be described with reference to FIG. 1, FIG. 2, and FIG. 6. In the second processing example, two types of hydrophobizing agents are supplied to the substrate W. In the second processing example, the steps up to the first hydrophobization processing (S104) are the same as those of the first processing example and thus the same reference symbols as those of the first processing example are attached and description thereof shall be omitted. Thus, in the following description, the steps performed after the first hydrophobization processing shall be described.

After the first hydrophobization processing (S104) has been performed, a second solvent rinsing processing (second solvent rinsing step) of supplying the solvent to the substrate W is performed (S107). Specifically, the controller 22 opens the solvent valve 18 to cause the solvent to be discharged from the central axis nozzle 14 toward the central portion of the upper surface of the substrate W while positioning the shielding plate 3 at the processing position and further making the substrate W rotate by the spin chuck 2. The solvent discharged from the central axis nozzle 14 is thereby supplied as the second solvent to the entire upper surface of the substrate W. As mentioned above, the solvent is a liquid that can dissolve the hydrophobizing agent and thus by supplying the solvent to the entire upper surface of the substrate W, the first hydrophobizing agent adhering to the substrate W is replaced by the solvent (second solvent rinsing processing). Then, when the second solvent rinsing processing has been performed for a predetermined time, the controller 22 closes the solvent valve 18 to stop the discharge of the solvent.

Thereafter, a second hydrophobization processing (hydrophobizing step, second hydrophobizing step) of supplying the second hydrophobizing agent (liquid) to the substrate is performed (S108). Specifically, the controller 22 controls the second hydrophobizing agent supply unit 17 to cause the second hydrophobizing agent to be discharged from the central axis nozzle 14 toward the central portion of the upper surface of the substrate W while positioning the shielding plate 3 at the processing position and further making the substrate W rotate by the spin chuck 2. The second hydrophobizing agent is thereby supplied to the entire upper surface of the substrate W. As mentioned above, the solvent is a liquid that can dissolve the hydrophobizing agent and thus by supplying the second hydrophobizing agent to the entire upper surface of the substrate W, the solvent adhering to the substrate W is replaced by the second hydrophobizing agent. The second hydrophobizing agent is thereby made to enter into internal portions of the patterns P and the upper surface of the substrate W is thereby hydrophobized (second hydrophobization processing). Then, when the second hydrophobization processing has been performed for a predetermined time, the controller 22 controls the second hydrophobizing agent supply unit 17 to stop the discharge of the second hydrophobizing agent.

Thereafter, a pre-drying rinsing processing (pre-drying rinsing step) of supplying the solvent to the substrate W is performed (S109). Specifically, the controller 22 opens the solvent valve 18 to cause the solvent to be discharged from the central axis nozzle 14 toward the central portion of the upper surface of the substrate W while positioning the shielding plate 3 at the processing position and further making the substrate W rotate by the spin chuck 2. The solvent discharged from the central axis nozzle 14 is thereby supplied to the entire upper surface of the substrate W. The second hydrophobizing agent adhering to the substrate W is thus replaced by the solvent (pre-drying rinsing processing). Then, when the pre-drying rinsing processing has been performed for a predetermined time, the controller 22 closes the solvent valve 18 to stop the discharge of the solvent.

Thereafter, a drying processing (drying step) of drying the substrate W is performed (S110). Specifically, the controller 22 controls the spin motor 7 to rotate the substrate W at a high rotation speed (for example, several thousand rpm) with the shielding plate 3 being positioned at the processing position. A large centrifugal force thus acts on the solvent adhering to the substrate W and the solvent is shaken off to the periphery of the substrate W. The solvent is thereby removed from the substrate W and the substrate W is dried (drying processing). After the drying processing has been performed for a predetermined time, the controller 22 controls the spin motor 7 to stop the rotation of the substrate W by the spin chuck 2. Further, the controller 22 controls the shielding plate elevating mechanism 9 to move the shielding plate 3 from the processing position to the retreat position. Thereafter, the substrate W that has been processed is carried out from the spin chuck 2 by the transfer robot.

FIG. 7 is a sectional view of an example of a substrate W processed by the substrate processing apparatus 1 according to the first embodiment of the present invention.

The substrate W processed by the substrate processing apparatus 1 is, for example, a substrate W having patterns P of a laminated film 32 formed thereon. The laminated film 32 includes, for example, a first film 32a, a second film 32b, and a third film 32c. The films 32a, 32b, and 32c are laminated in the order of: the third film 32c, the second film 32b, and the first film 32a from a side close to the upper surface of the substrate W itself. That is, the first film 32a corresponds to being an upper layer film with respect to the second film 32b and the third film 32c, and the second film 32b and the third film 32c correspond to being lower layer films with respect to the first film 32a. Also, the second film 32b corresponds to being an upper layer film with respect to the third film 32c, and the third film 32c corresponds to being a lower layer film with respect to the second film 32b.

The first film 32a is, for example, any of a silicon-containing film, a nitride film, and a metal film. The same applies to each of the second film 32b and the third film 32c.

The silicon-containing film is, for example, any of a polysilicon film, an $SiO_2$ film, an SiN film, a BSG film (an $SiO_2$ film that contains boron), and a TEOS film (an $SiO_2$ film formed by the CVD method using TEOS (tetraethoxysilane)). The $SiO_2$ film, BSG film, and TEOS film are oxide films.

The nitride film is, for example, an SiN film. The SiN film is also a silicon-containing film.

The metal film is, for example, a film that contains at least one of Ti, W, Cu, and Al. The metal film is, for example, either a TiN film or a W film.

Specific examples of combinations of the first film 32a, the second film 32b, and the third film 32c include "silicon-containing film (first film 32a), silicon-containing film (second film 32b), and metal film (third film 32c)," "metal film (first film 32a), silicon-containing film (second film 32b), and silicon-containing film (third film 32c)," "SiN film (first film 32a), BSG film (second film 32b), and polysilicon film (third film 32c)," "BSG film (first film 32a), TEOS film (second film 32b), and polysilicon film (third film 32c)," and "SiN film (first film 32a), metal film (second film 32b), and arbitrary film (third film 32c)." The first film 32a, the second film 32b, and the third film 32c are not restricted to these combinations and may be of other combinations.

A silicon-containing film is hydrophobized by a silicon hydrophobizing agent. Likewise, an oxide film and a nitride film are hydrophobized by a silicon hydrophobizing agent. Also, a metal film is hydrophobized by a metal hydrophobizing agent.

In the following description, specific combinations of the first film 32a, the second film 32b, and the third film 32c and specific examples of the first hydrophobizing agent and the second hydrophobizing agent used for the respective combinations shall be described.

FIG. 8 is a table for describing hydrophobizing agents used in a case where the first film 32a, the second film 32b, and the third film 32c are a silicon-containing film, a silicon-containing film, and a metal film, respectively.

In the case where the first film 32a, the second film 32b, and the third film 32c are, for example, a silicon-containing film, a silicon-containing film, and a metal film, respectively, a silicon hydrophobizing agent or a metal hydrophobizing agent is used as the first hydrophobizing agent in the first processing example. The silicon-containing film or the metal film is thus hydrophobized. Although unillustrated, even in a case where the first film 32a, the second film 32b, and the third film 32c are a metal film, a silicon-containing film, and a silicon-containing film, respectively, for example, a silicon hydrophobizing agent or a metal hydrophobizing agent is used as the first hydrophobizing agent in the first processing example.

Meanwhile, in the second processing example, for example, a metal hydrophobizing agent is used as the first hydrophobizing agent and a silicon hydrophobizing agent is used as the second hydrophobizing agent. That is, after the lower layer film (third film 32c) has been hydrophobized, the upper layer films (first film 32a and second film 32b) are hydrophobized, and the substrate W is thus hydrophobized in the order of the lower layer film and the upper layer films. Thus, in the case where the first film 32a, the second film 32b, and the third film 32c are a metal film, a silicon-containing film, and a silicon-containing film, respectively, in the second processing example, for example, the silicon hydrophobizing agent is used as the first hydrophobizing agent and the metal hydrophobizing agent is used as the second hydrophobizing agent.

When in a case of the substrate W having a silicon-containing film and a metal film, a chlorine-containing hydrophobizing agent (for example, a fluorinated alkylchlorosilane) is used as the first hydrophobizing agent or the second hydrophobizing agent, the metal film reacts with hydrochloric acid, which is formed by reaction of the hydrophobizing agent. Thus, in the case of the substrate W having a silicon-containing film and a metal film, a hydrophobizing agent that does not contain chlorine (for example, the nonchloro hydrophobizing agent mentioned above) is preferably used as the first hydrophobizing agent or the second hydrophobizing agent in processing in both the first processing example and the second processing example. The reaction of hydrochloric acid and the metal film can thereby be prevented.

FIG. 9 is a table for describing hydrophobizing agents used in a case where the first film 32a, the second film 32b, and the third film 32c are an SiN film, a BSG film, and a polysilicon film, respectively.

In the case where the first film 32a, the second film 32b, and the third film 32c are an SiN film, a BSG film, and a polysilicon film, respectively, for example, a silicon hydrophobizing agent is used as the first hydrophobizing agent in the first processing example. In the case where the silicon hydrophobizing agent is used as the first hydrophobizing agent, the first film 32a, the second film 32b, and the third film 32c are hydrophobized. On the other hand, if the metal hydrophobizing agent is used as the first hydrophobizing agent, the hydrophobizing performance is low because all of the first film 32a, the second film 32b, and the third film 32c are silicon-containing films. Thus, in the first processing example, the silicon hydrophobizing agent is preferably used as the first hydrophobizing agent.

Meanwhile, in the second processing example, for example, a silicon hydrophobizing agent I is used as the first hydrophobizing agent and a silicon hydrophobizing agent II is used as the second hydrophobizing agent. When the silicon hydrophobizing agent I is supplied to the substrate W as the first hydrophobizing agent, the first film 32a, the second film 32b, and the third film 32c are hydrophobized. When the silicon hydrophobizing agent II is thereafter supplied as the second hydrophobizing agent to the substrate W, the first film 32a (SiN film) is further hydrophobized. That is, the SiN film is hydrophobized by the silicon hydrophobizing agent I and thereafter further hydrophobized by the silicon hydrophobizing agent II of a different type from the silicon hydrophobizing agent I. Thus, after the upper layer film and the lower layer films have been hydrophobized, the upper layer film is further hydrophobized. Details of the hydrophobization processing by the silicon hydrophobizing agent I and the silicon hydrophobizing agent II shall be described later.

FIG. 10 is a table for describing hydrophobizing agents used in a case where the first film 32a, the second film 32b, and the third film 32c are an SiN film, a metal film, and an arbitrary film, respectively.

In the case where the first film 32a, the second film 32b, and the third film 32c are an SiN film, a metal film, and an arbitrary film, respectively, for example, a silicon hydrophobizing agent (preferably a nonchloro hydrophobizing agent) or a metal hydrophobizing agent is used as the first hydrophobizing agent in the first processing example. In the case where the silicon hydrophobizing agent is used as the first hydrophobizing agent, the first film 32a (SiN film) is hydrophobized. On the other hand, in the case where the metal hydrophobizing agent is used as the first hydrophobizing agent, the second film 32b (metal film) is hydrophobized.

Meanwhile, in the second processing example, for example, a metal hydrophobizing agent is used as the first hydrophobizing agent and a silicon hydrophobizing agent (preferably a nonchloro hydrophobizing agent) is used as the second hydrophobizing agent. When the metal hydrophobizing agent is supplied as the first hydrophobizing agent to the substrate W, the second film 32b is hydrophobized. When the silicon hydrophobizing agent is thereafter supplied as the second hydrophobizing agent to the substrate W, the first film 32a (SiN film) is hydrophobized. The upper layer film is thus hydrophobized after the lower layer film has been hydrophobized.

Figure 11:
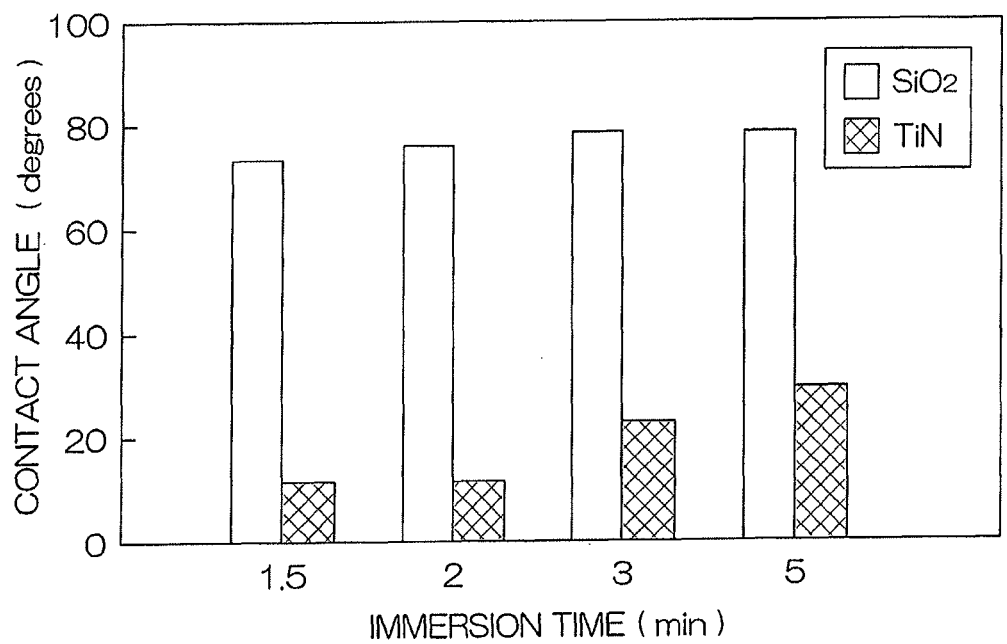
FIG. 11 is a graph of contact angles of pure water with respect to $SiO_2$ and TiN test pieces that were immersed in a silicon hydrophobizing agent.
Figure 12:
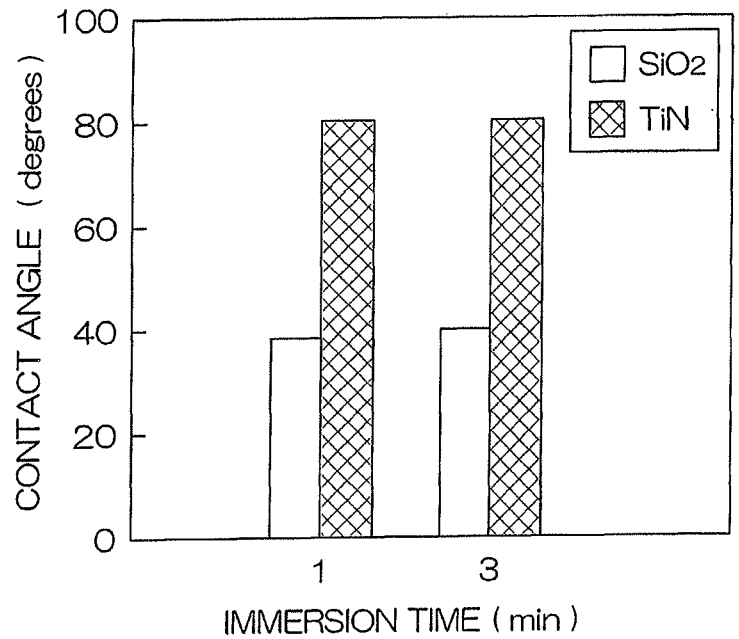
FIG. 12 is a graph of contact angles of pure water with respect to $SiO_2$ and TiN test pieces that were immersed in a metal hydrophobizing agent.
Figure 13:
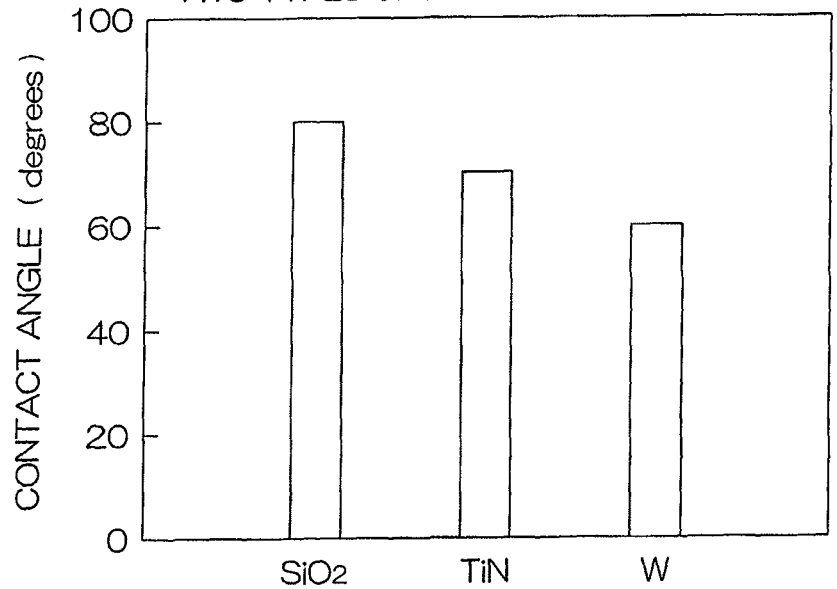
FIG. 13 is a graph of contact angles of pure water with respect to $SiO_2$, TiN, and W test pieces that were successively immersed in the silicon hydrophobizing agent and the metal hydrophobizing agent.

FIG. 11 is a graph of contact angles of pure water with respect to $SiO_2$ and TiN test pieces that were immersed in a silicon hydrophobizing agent. Also, FIG. 12 is a graph of contact angles of pure water with respect to $SiO_2$ and TiN test pieces that were immersed in a metal hydrophobizing agent. Also, FIG. 13 is a graph of contact angles of pure water with respect to $SiO_2$, TiN, and W test pieces that were successively immersed in the silicon hydrophobizing agent and the metal hydrophobizing agent.

As shown in FIG. 11, the contact angle of pure water with respect to the $SiO_2$ test piece that was immersed in the silicon hydrophobizing agent is no less than 70 degrees for all immersion times. Also, as shown in FIG. 11, the contact angle of pure water with respect to the TiN test piece that was immersed in the silicon hydrophobizing agent is no more than 20 degrees for an immersion time of no more than 2 minutes and no more than 30 degrees for an immersion time of no less than 3 minutes.

Meanwhile, as shown in FIG. 12, the contact angle of pure water with respect to the $SiO_2$ test piece that was immersed in the metal hydrophobizing agent is approximately 40 degrees for all immersion times. Also, as shown in FIG. 12, the contact angle of pure water with respect to the TiN test piece that was immersed in the metal hydrophobizing agent is approximately 80 degrees for all immersion times.

From the measurement values shown in FIG. 11 and FIG. 12, it can be understood that although the silicon hydrophobizing agent can hydrophobize a silicon-containing compound ($SiO_2$) sufficiently, it cannot hydrophobize a metal-containing compound (TiN) sufficiently. It can also be understood that although the metal hydrophobizing agent can hydrophobize a metal-containing compound (TiN) sufficiently, it cannot hydrophobize a silicon-containing compound ($SiO_2$) sufficiently.

Meanwhile, as shown in FIG. 13, the contact angles of pure water with respect to the $SiO_2$, TiN, and W test pieces that were successively immersed in the silicon hydrophobizing agent and the metal hydrophobizing agent are approximately 80 degrees, approximately 70 degrees, and approximately 60 degrees respectively. Thus, by supplying both hydrophobizing agents of the silicon hydrophobizing agent and the metal hydrophobizing agent to the substrate W, the substrate W that includes a silicon-containing film and a metal film can be hydrophobized sufficiently.

Figure 14:
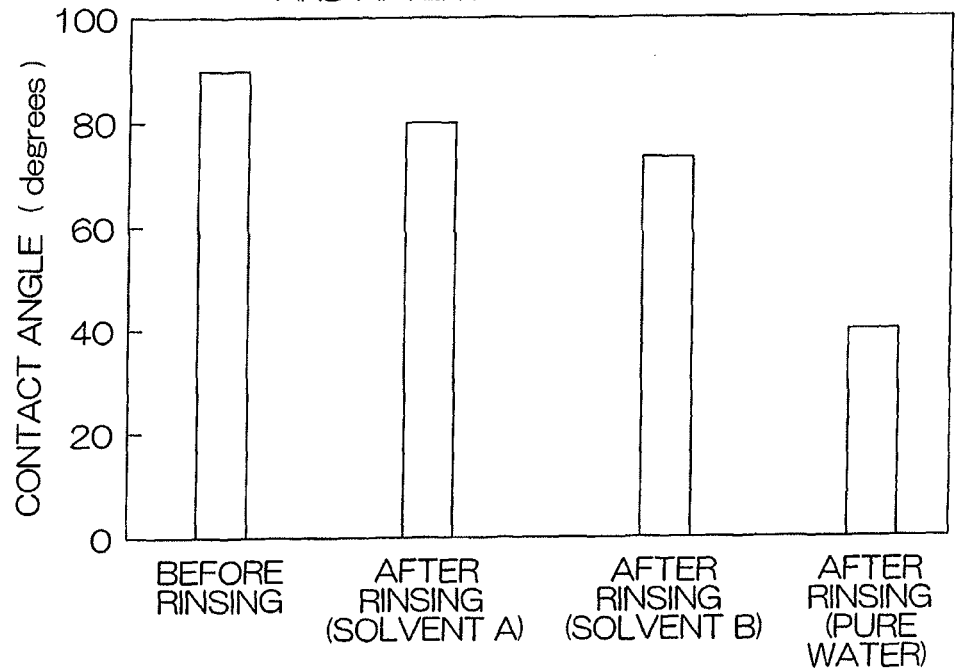
FIG. 14 is a graph of contact angles before and after rinsing processing of a metal-containing compound that was immersed in a metal hydrophobizing agent.

FIG. 14 is a graph of contact angles before and after rinsing processing of a metal-containing compound that was immersed in a metal hydrophobizing agent. The contact angle before rinsing in FIG. 14 is the contact angle before the metal-containing compound, which was immersed in an amine having a hydrophobic group as an example of a metal hydrophobizing agent, was rinsed. Also, each of the contact angles after rinsing in FIG. 14 is the contact angle after the metal-containing compound immersed in the amine having the hydrophobic group was rinsed by any of a solvent A, a solvent B, and pure water. The solvent A and the solvent B are solvents of different types. The solvent A is a solvent used as the first solvent and the second solvent in the first processing example and the second processing example. The same applies to the solvent B.

As shown in FIG. 14, the contact angle of pure water with respect to the metal-containing compound immersed in the amine having the hydrophobic group (contact angle before rinsing) is approximately 90 degrees. When the metal-containing compound is rinsed by the solvent A, the contact angle decreases by approximately 10 degrees. Also, when the metal-containing compound is rinsed by the solvent B, the contact angle decreases by approximately 15 degrees. Also, when the metal-containing compound is rinsed by pure water, the contact angle decreases by approximately 50 degrees.

From the measurement values shown in FIG. 14, when pure water (a liquid that contains an OH group) is supplied to the metal-containing compound immersed in the amine having the hydrophobic group, the contact angle decreases significantly in comparison to the cases of supplying the solvent A and the solvent B. Thus, by not supplying pure water to the substrate W after supplying the amine having the hydrophobic group to the substrate W, that is, by maintaining a state where pure water does not contact the substrate W, the decrease in the contact angle of pure water with respect to the substrate W can be suppressed or prevented.

Figure 15:
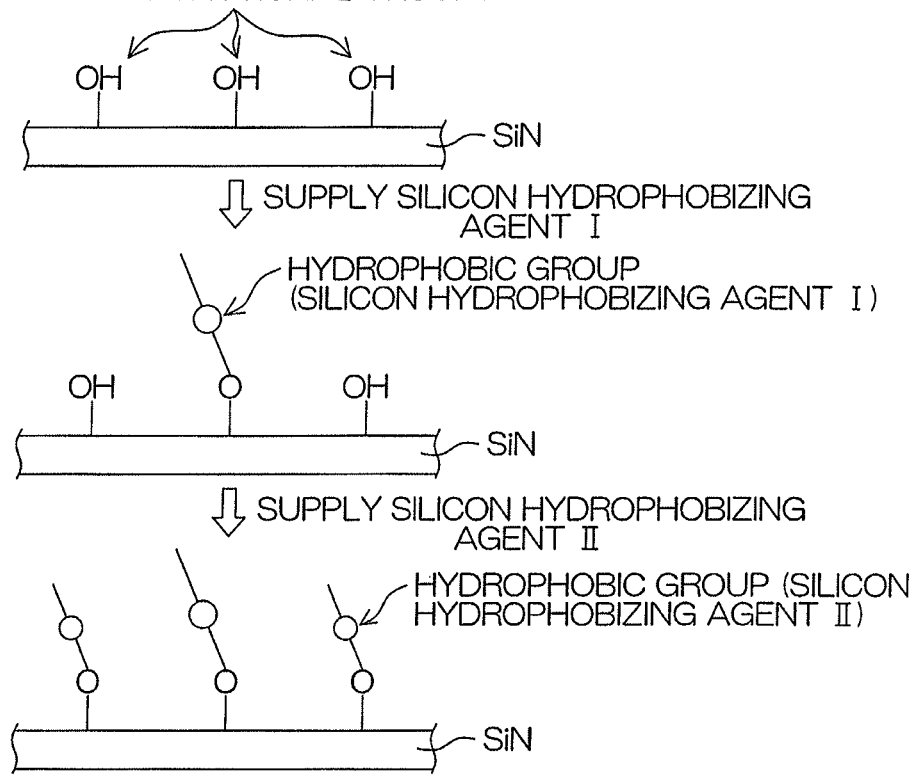
FIG. 15 is a schematic diagram of changes in a surface state of SiN when a silicon hydrophobizing agent I and a silicon hydrophobizing agent II are successively supplied to SiN.

FIG. 15 is a schematic diagram of changes in a surface state of SiN when the silicon hydrophobizing agent I and the silicon hydrophobizing agent II are successively supplied to SiN.

As mentioned above, SiN is hydrophobized by both the silicon hydrophobizing agent I and the silicon hydrophobizing agent II. A hydrophobic group of the silicon hydrophobizing agent II is shorter than a hydrophobic group of the silicon hydrophobizing agent I. That is, a molecular weight of the hydrophobic group of the silicon hydrophobizing agent II is less than a molecular weight of the hydrophobic group of the silicon hydrophobizing agent I. A reactivity of a hydrophobizing agent with respect to SiN is higher the shorter the hydrophobic group. The silicon hydrophobizing agent II is thus higher in reactivity to SiN than the silicon hydrophobizing agent I. On the other hand, if the reactivity with respect to SiN is the same, the contact angle of pure water with respect to SiN can be increased more the longer the hydrophobic group. The silicon hydrophobizing agent I can thus hydrophobize SiN more efficiently than the silicon hydrophobizing agent II.

For example, when SiN and $SiO_2$ are compared, although both are silicon-containing compounds, SiN is lower in the number of functional groups (groups of high reactivity) than $SiO_2$. Thus, even if the silicon hydrophobizing agent II is supplied to SiN and the functional groups of SiN and the hydrophobic group of the silicon hydrophobizing agent II are reacted efficiently, the surface of SiN is not hydrophobized sufficiently because SiN is low in the number of functional groups and the hydrophobic group of the silicon hydrophobizing agent II is short. That is, the contact angle is not increased sufficiently.

Meanwhile, although the hydrophobic group of the silicon hydrophobizing agent I is long, the silicon hydrophobizing agent I is lower in reactivity with respect to SiN than the silicon hydrophobizing agent II. Thus, even if the silicon hydrophobizing agent I is supplied to SiN, a portion of the functional groups of SiN does not react with the hydrophobic group of the silicon hydrophobizing agent I and the hydrophobicity of SiN thus does not increase sufficiently as a whole. Thus, by supplying both the silicon hydrophobizing agent I and the silicon hydrophobizing agent II to SiN, both the silicon hydrophobizing agent I and the silicon hydrophobizing agent II can be reacted with SiN to hydrophobize SiN sufficiently.

Especially by supplying the silicon hydrophobizing agent I to SiN and thereafter supplying the silicon hydrophobizing agent II of high reactivity to SiN as shown in FIG. 15, the hydrophobic group of the silicon hydrophobizing agent I can be reacted with the functional groups of SiN and the hydrophobic group of the silicon hydrophobizing agent II can be reacted with the functional groups of SiN that remain without reacting with the hydrophobic group of the silicon hydrophobizing agent I. SiN can thereby be hydrophobized sufficiently. Thus, for an SiN film, it is preferable to supply the silicon hydrophobizing agent I with the long hydrophobic group and thereafter supply the silicon hydrophobizing agent II with the short hydrophobic group.

Figure 16:
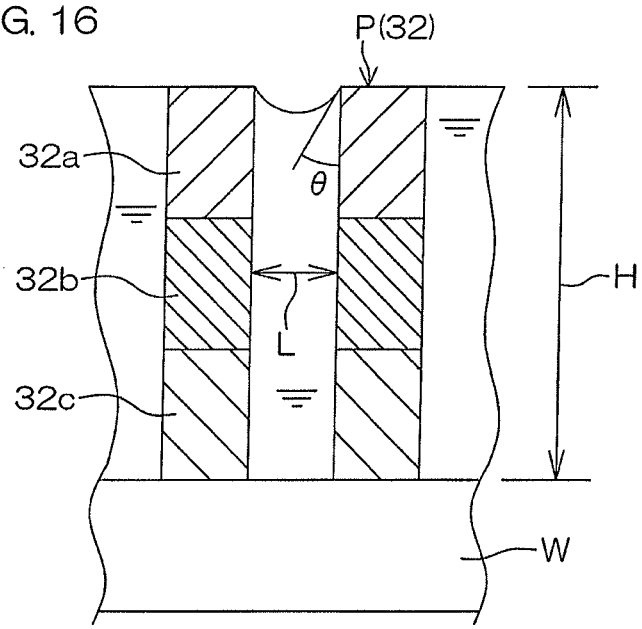
FIG. 16 is a schematic sectional view of a substrate for describing a force applied to patterns.

FIG. 16 is a schematic sectional view of a substrate W for describing a force applied to patterns P.

When the substrate W with the patterns P formed thereon is dried, a force that draws the patterns P toward each other is applied as the substrate W dries and the patterns P may thereby collapse. The force F applied to the patterns P is expressed, for example, by the following formula (1).

$$F=(2\times\sigma\times H\cos\theta)/L \qquad \text{(Formula 1)}$$

"σ" is a surface tension of the processing liquid, "θ" is a contact angle, "H" is a height of the patterns P, and "L" is an interval between the patterns P.

From the formula (1), it can be understood that the lower the surface tension σ of the processing liquid, the less the force F applied to the patterns P. Thus, by lowering the surface tension σ of the processing liquid, the force F applied to the patterns P can be decreased to thereby suppress or prevent collapse of the patterns P.

It can also be understood that the force F applied to the patterns P decreases the closer the contact angle θ is to 90 degrees. Thus, by hydrophobizing the surface of the substrate W and thereby making the contact angle θ approach 90 degrees, collapse of the patterns P can be suppressed or prevented.

On the other hand, if the hydrophobization of the surface of the substrate W is insufficient, the force F applied to the patterns P is not reduced sufficiently and collapse of the patterns P cannot be suppressed sufficiently. It is thus preferable to sufficiently hydrophobize the entire surface of the substrate W to sufficiently suppress collapse of the patterns P.

In the first processing example and the second processing example described above, the substrate W is hydrophobized by the hydrophobizing agents (first hydrophobization processing and second hydrophobization processing). The contact angle of the processing liquid with respect to the substrate W can thereby be made to approach 90 degrees. The force applied to the patterns P can thereby be reduced to suppress or prevent collapse of the patterns P.

Also, in the second processing example, a plurality of types of the hydrophobizing agents are supplied to the substrate W (first hydrophobization processing and second hydrophobization processing). Thus, in the case of processing the substrate W, which has formed thereon the patterns P of the laminated film 32 that includes the silicon-containing film and the metal film, the entire front surface of the substrate W can be hydrophobized sufficiently. Further, in a case of processing a substrate W having an SiN film or other nitride film, the hydrophobicity of the substrate W can be increased sufficiently. Collapse of the patterns P can thereby be suppressed or prevented.

In the first processing example and the second processing example, the solvent or the hydrophobizing agent and the solvent is or are supplied until the substrate W has been dried after having been hydrophobized (from the end of the first hydrophobization processing to the end of the drying processing). The hydrophobizing agent and the solvent are liquids that do not contain water. Thus, in the first processing example and the second processing example, the state in which pure water does not contact the substrate W is maintained until the substrate W has been dried after having been hydrophobized.

As was described with reference to FIG. 14, when, after supplying the amine having the hydrophobic group as an example of the metal hydrophobizing agent to the substrate W that includes the metal film, pure water is supplied to the substrate W, the hydrophobicity of the substrate W decreases significantly. Thus, by maintaining the state in which pure water does not contact the substrate W until the substrate W has been dried after having been hydrophobized, the hydrophobicity of the substrate W is prevented from significantly decreasing in the case where the amine having the hydrophobic group is supplied to the substrate W. Collapse of the patterns P can thereby be suppressed or prevented.

Also, by maintaining the state in which pure water does not contact the substrate W until the substrate W has been dried after having been hydrophobized, formation of watermarks can be suppressed or prevented.

Also, in the second processing example, the upper layer films are hydrophobized by the second hydrophobizing agent after the lower layer film has been hydrophobized by the first hydrophobizing agent or after the lower layer film and the upper layer films have been hydrophobized by the first hydrophobizing agent. For example, if the hydrophobizing agent is further supplied to the substrate W after the upper layer films have been hydrophobized, the hydrophobizing agent may not be supplied sufficiently to the lower layer film because the upper layer films have already been hydrophobized. Thus, by supplying the second hydrophobizing agent, which hydrophobizes the upper layer films, to the substrate W after the lower layer film has been hydrophobized or after the lower layer film and the upper layer films have been hydrophobized, the upper layer films and the lower layer film can be hydrophobized sufficiently. The substrate W can thereby be hydrophobized sufficiently.

Also, in the first processing example and the second processing example, pure water, which is an example of a rinsing liquid, is supplied to the substrate W (water rinsing processing). Thereafter, the solvent is supplied as the first solvent to the substrate W (first solvent rinsing processing). The pure water adhering to the substrate W is thereby replaced by the solvent. The first hydrophobizing agent and the second hydrophobizing agent are thus supplied to the substrate W in a state where pure water is removed. The first hydrophobizing agent and the second hydrophobizing agent are thus prevented from contacting pure water. Thus, in a case where hydrophobizing agents that decrease in activity by contacting water are used as the first hydrophobizing agent and the second hydrophobizing agent, decreases in the activities of the first hydrophobizing agent and the second hydrophobizing agent are prevented. The substrate W can thereby be hydrophobized sufficiently.

Also, in the second processing example, the solvent that can dissolve the first hydrophobizing agent and the second hydrophobizing agent is supplied as the second solvent to the substrate W after performing the first hydrophobization processing and before performing the second hydrophobization processing (second solvent rinsing processing). In a case where the first hydrophobizing agent and the second hydrophobizing agent do not readily mix together, even if the second hydrophobizing agent is supplied to the substrate W in the state where the first hydrophobizing agent is adhering to the substrate W, the first hydrophobizing agent adhering to the substrate W cannot readily be replaced by the second hydrophobizing agent. The second hydrophobizing agent thus does not contact the front surface of the substrate W sufficiently.

Meanwhile, the solvent (second solvent) can dissolve the first hydrophobizing agent and the second hydrophobizing agent. Thus, by supplying the solvent to the substrate after performing the first hydrophobization processing, the first hydrophobizing agent adhering to the substrate W can be replaced by the solvent and the first hydrophobizing agent can thereby be removed from the substrate W. By then supplying the second hydrophobizing agent to the substrate W after the second solvent rinsing processing has been performed, the solvent adhering to the substrate W can be replaced by the second hydrophobizing agent and the solvent can thereby be removed from the substrate W. Thus, even in the case where the first hydrophobizing agent and the second hydrophobizing agent do not readily mix together, the first hydrophobizing agent adhering to the substrate W can be replaced by the second hydrophobizing agent. The second hydrophobizing agent can thereby be made to react with the substrate W and the substrate W can be hydrophobized by the second hydrophobizing agent.

Also, in the first processing example and the second processing example, the solvent is supplied to the substrate W in the pre-drying rinsing processing. Thereafter, the solvent adhering to the substrate W is removed and the substrate W is dried. The solvent supplied to the substrate W in the pre-drying rinsing processing is lower in surface tension than water. Collapse of the patterns P can thus be suppressed or prevented more than in a case where pure water is supplied to the substrate W in the pre-drying rinsing processing. Further, the solvent supplied to the substrate W in the pre-drying rinsing processing is lower in boiling point than water. The substrate W can thus be dried more rapidly than in the case where pure water is supplied to the substrate W in the pre-drying rinsing processing.

Also, in the first processing example and the second processing example, the first hydrophobizing agent and the second hydrophobizing agent that have been diluted by the diluting solvent are supplied to the substrate W. The diluting solvent can dissolve the solvent used as the first solvent and the second solvent. Thus, by the first hydrophobizing agent and the second hydrophobizing agent being diluted by the diluting solvent, compatibilities of the first hydrophobizing agent and the second hydrophobizing agent with the first solvent and the second solvent are increased. The solvent (first solvent and second solvent) adhering to the substrate W can thus be replaced readily by the first hydrophobizing agent and the second hydrophobizing agent.

Also, in the first processing example and the second processing example, the hydrophobizing agent (first hydrophobizing agent and second hydrophobizing agent) and the diluting solvent are mixed inside the collective pipe 31. That is, each of the first hydrophobizing agent and the second hydrophobizing agent is diluted by the diluting solvent immediately before being supplied to the substrate W. Thus, in a case where hydrophobizing agents that gradually decrease in activity by being diluted by the diluting solvent are used as the first hydrophobizing agent and the second hydrophobizing agent, the activities of the first hydrophobizing agent and the second hydrophobizing agent are prevented from significantly decreasing. The substrate W can thereby be hydrophobized sufficiently.

Second Embodiment

Figure 17:
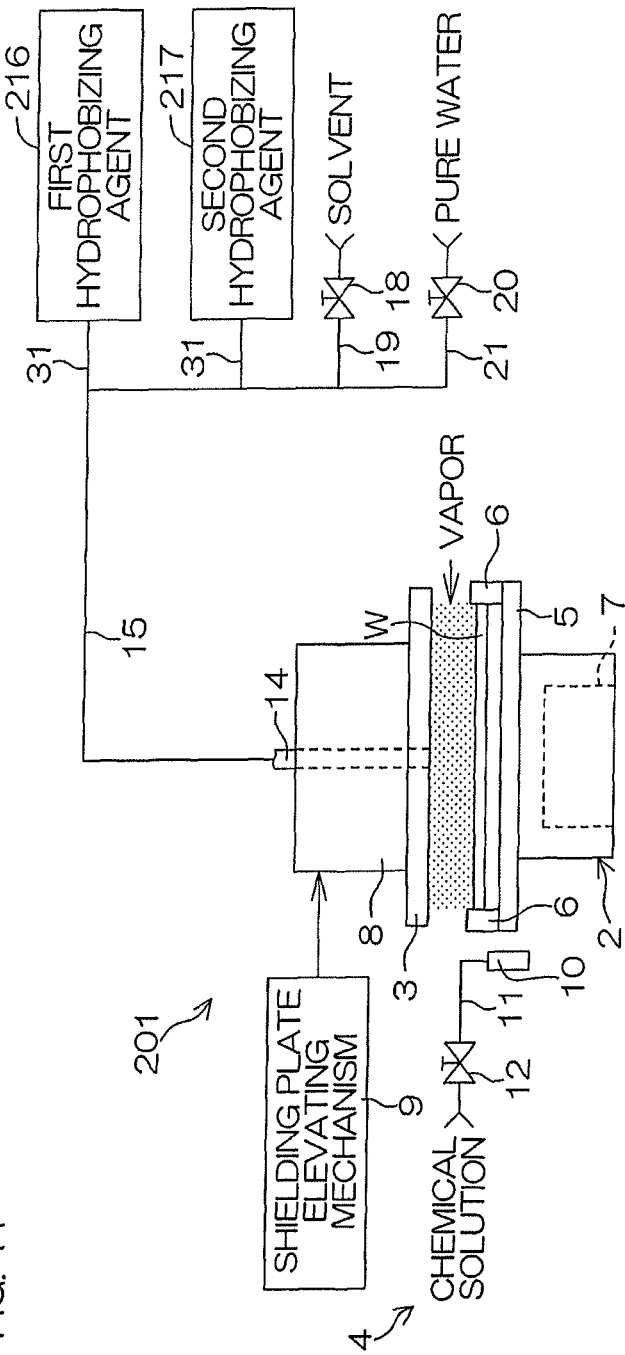
FIG. 17 is a schematic view of a general arrangement of a substrate processing apparatus according to a second embodiment of the present invention.
Figure 18:
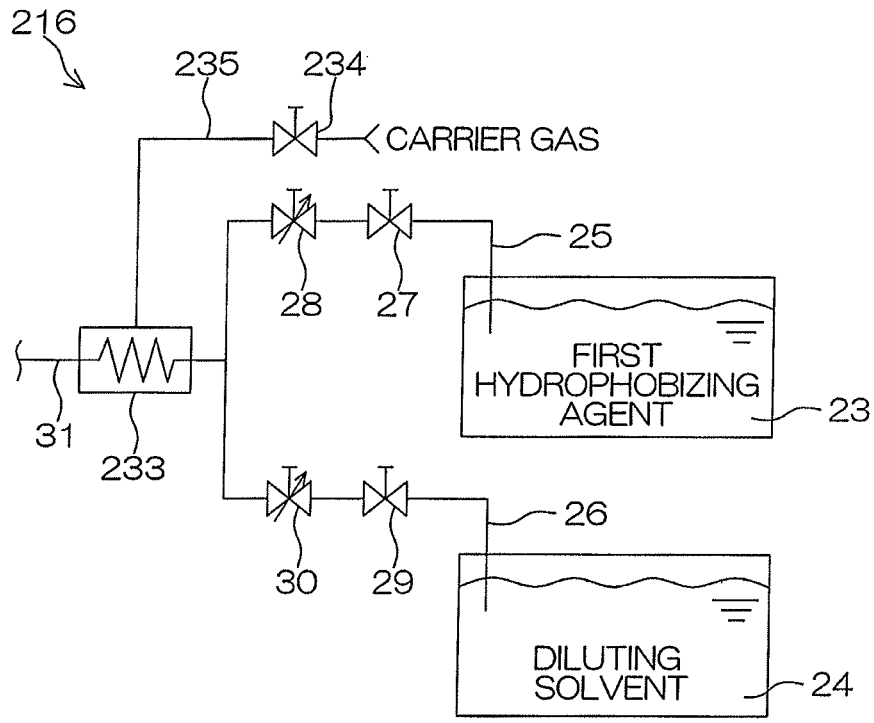
FIG. 18 is a schematic view of a general arrangement of a first hydrophobizing agent supply unit according to the second embodiment of the present invention.

FIG. 17 is a schematic view of a general arrangement of a substrate processing apparatus 201 according to a second embodiment of the present invention. FIG. 18 is a schematic view of a general arrangement of a first hydrophobizing agent supply unit 216 according to the second embodiment of the present invention. In FIG. 17 and FIG. 18, component portions that are equivalent to the respective portions shown in FIG. 1 to FIG. 16 described above are provided with the same reference symbols as in FIG. 1, etc., and description thereof shall be omitted.

A main point of difference of the second embodiment with respect to the first embodiment is that the substrate processing apparatus 201 includes the first hydrophobizing agent supply unit 216 (hydrophobizing agent supply unit, first hydrophobizing agent supply unit) and a second hydrophobizing agent supply unit 217 (hydrophobizing agent supply unit, second hydrophobizing agent supply unit) that supply a vapor of the first hydrophobizing agent and a vapor of the second hydrophobizing agent, respectively, as shown in FIG. 17. The general arrangement of the first hydrophobizing agent supply unit 216 and the general arrangement of the second hydrophobizing agent supply unit 217 are the same, and thus the general arrangement of the first hydrophobizing agent supply unit 216 shall be described below.

As shown in FIG. 18, the first hydrophobizing agent supply unit 216 includes the first tank 23 storing the first hydrophobizing agent (liquid) and the second tank 24 storing a diluting solvent (liquid). Further, the first hydrophobizing agent supply unit 216 includes a heater 233 interposed in the collective pipe 31 and a carrier gas supply pipe 235 having a valve 234 interposed therein. The carrier gas supply pipe 235 is connected to the collective pipe 31. A temperature of the heater 233 is controlled by the controller 22 (see FIG. 3). Also, opening and closing of the valve 234 are controlled by the controller 22. When the valve 234 is opened, a carrier gas is supplied to the collective pipe 31. Nitrogen gas, argon gas, and other inert gases can be cited as examples of the carrier gas.

The diluting solvent is the same as that of the first embodiment. In the second embodiment, for example, a solvent that contains an HFE is used as the diluting solvent. The HFE is lower in boiling point than water. Thus, by diluting the first hydrophobizing agent by this diluting solvent, the boiling point of the diluted first hydrophobizing agent can be lowered. The first hydrophobizing agent that has been diluted can thus be vaporized readily. Also, the HFE is nonflammable. The controller 22 controls the opening degrees of the first flow regulating valve 28 and the second flow regulating valve 30 so that the diluted first hydrophobizing agent is nonflammable. Measures for preventing explosion of the substrate processing apparatus 201 are thus made unnecessary.

The controller 22 opens the first valve 27, the second valve 29, and the valve 234 and further makes the collective pipe 31 be heated by the heater 233. By opening the first valve 27 and the second valve 29, the first hydrophobizing agent (liquid) and the diluting solvent (liquid) are supplied to the collective pipe 31. The first hydrophobizing agent and the diluting agent supplied to the collective pipe 31 are mixed inside the collective pipe 31 and thereafter heated by the heater 233. The mixed solution of the first hydrophobizing agent and the diluting solvent is thereby vaporized and the liquid of the diluted first hydrophobizing agent changes to a vapor. The vapor of the first hydrophobizing agent produced inside the collective pipe 31 is then made to flow toward the central axis nozzle 14 by the carrier gas supplied from the carrier gas supply pipe 235 to the collective pipe 31. The vapor of the first hydrophobizing agent is thereby discharged from the central axis nozzle 14.

As shown in FIG. 17, the controller 22 causes the vapor of the first hydrophobizing agent and the vapor of the second hydrophobizing agent to be discharged from the central axis nozzle 14 with the shielding plate 3 being positioned at the processing position. The vapor of the hydrophobizing agent discharged from the central axis nozzle 14 spreads outward between the shielding plate 3 and the substrate W and is exhausted from between the shielding plate 3 and the substrate W. The space between the shielding plate 3 and the substrate W is thereby filled with the vapor of the hydrophobizing agent. Also, the vapor of the hydrophobizing agent discharged from the central axis nozzle 14 flows outward along the upper surface of the substrate W. The vapor of the hydrophobizing agent is thereby supplied to the entire upper surface of the substrate W. While the vapor of the hydrophobizing agent is being discharged from the central axis nozzle 14, the substrate W held by the spin chuck 2 may be rotated about the vertical rotational axis passing through the center of the substrate W or may be held in a non-rotating state.

Figure 19:
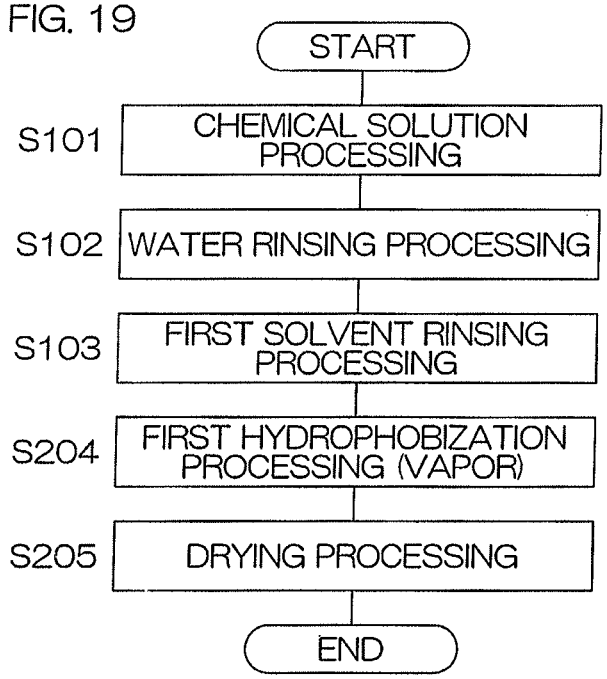
FIG. 19 is a process chart for describing a third processing example of processing a substrate by the substrate processing apparatus according to the second embodiment of the present invention.

FIG. 19 is a process chart for describing a third processing example of processing a substrate W by the substrate processing apparatus 201 according to the second embodiment of the present invention. In the following description, the processing example of processing the substrate W having the patterns P formed on the front surface, which is the device forming surface, shall be described with reference to FIG. 17 and FIG. 19. In the third processing example, the steps up to the first solvent rinsing processing (S103) are the same as those of the first processing example and thus the same reference symbols as those of the first processing example are attached and description thereof shall be omitted. Thus, in the following description, the steps performed after the first solvent rinsing processing shall be described.

After the first solvent rinsing processing (S103) has been performed, a first hydrophobization processing (hydrophobizing step, vapor supply step, first hydrophobizing step, first vapor supply step) of supplying the first hydrophobizing agent (vapor) to the substrate W is performed (S204). Specifically, the controller 22 controls the first hydrophobizing agent supply unit 216 to cause the vapor of the first hydrophobizing agent to be discharged from the central axis nozzle 14 toward the central portion of the upper surface of the substrate W with the shielding plate 3 being positioned at the processing position. The solvent adhering to the substrate W is removed from the substrate W while dissolving into the vapor of the first hydrophobizing agent that flows outward along the upper surface of the substrate W. Also, by the vapor of the first hydrophobizing agent flowing outward along the upper surface of the substrate W, the vapor of the first hydrophobizing agent is supplied to the entire upper surface of the substrate W and the vapor of the first hydrophobizing agent enters into the internal portions of the patterns P. The upper surface of the substrate W is thereby hydrophobized (first hydrophobization processing). Then, when the first hydrophobization processing has been performed for a predetermined time, the controller 22 controls the first hydrophobizing agent supply unit 216 to stop the discharge of the vapor of the first hydrophobizing agent.

Thereafter, a drying processing (drying step, vaporizing step) of drying the substrate W is performed (S205). Specifically, the controller 22 makes the liquid droplets of the first hydrophobizing agent adhering to the upper surface of the substrate W vaporize to thereby dry the substrate W (drying processing). The controller 22 may make the substrate W rotate by the spin chuck 2 to make the liquid droplets of the first hydrophobizing agent vaporize by an air flow resulting from the rotation of the substrate W or may make the liquid droplets of the first hydrophobizing agent vaporize naturally while keeping the substrate W still. Also, the controller 22 may make the liquid droplets of the first hydrophobizing agent vaporize while making the transfer robot transfer the substrate W.

Figure 20:
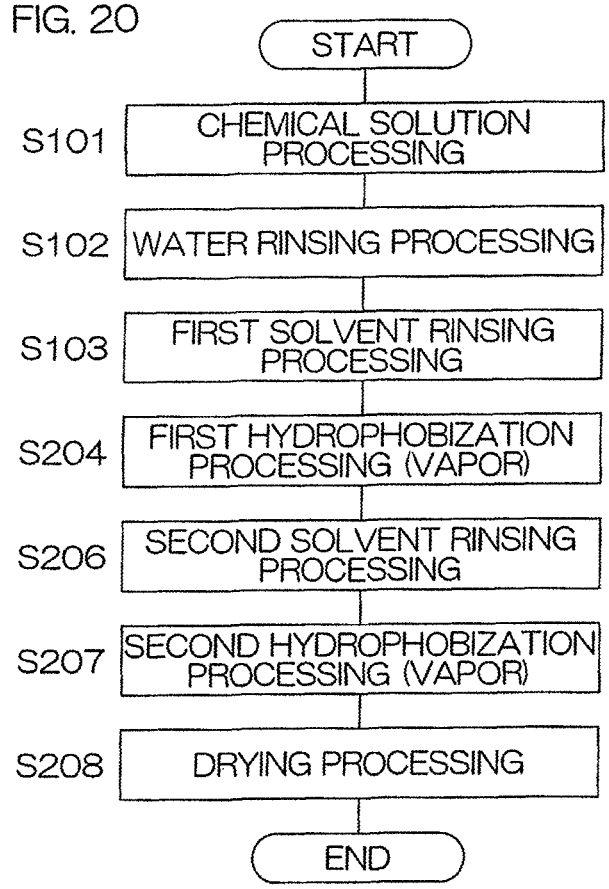
FIG. 20 is a process chart for describing a fourth processing example of processing a substrate by the substrate processing apparatus according to the second embodiment of the present invention.

FIG. 20 is a process chart for describing a fourth processing example of processing a substrate W by the substrate processing apparatus 201 according to the second embodiment of the present invention. In the following description, the processing example of processing the substrate W having the patterns P formed on the front surface, which is the device forming surface, shall be described with reference to FIG. 17 and FIG. 20. In the fourth processing example, vapors of two types of hydrophobizing agents are supplied to the substrate W. In the fourth processing example, the steps up to the first hydrophobization processing (S204) are the same as those of the third processing example and thus the same reference symbols as those of the third processing example are attached and description thereof shall be omitted. Thus, in the following description, the steps performed after the first hydrophobization processing shall be described.

After the first hydrophobization processing (S204) has been performed, a second solvent rinsing processing (second solvent rinsing step) of supplying the solvent to the substrate W is performed (S206). Specifically, the controller 22 opens the solvent valve 18 to cause the solvent to be discharged from the central axis nozzle 14 toward the central portion of the upper surface of the substrate W while positioning the shielding plate 3 at the processing position and further making the substrate W rotate by the spin chuck 2. The solvent discharged from the central axis nozzle 14 is thereby supplied as the second solvent to the entire upper surface of the substrate W. As mentioned above, the solvent is a liquid that can dissolve the hydrophobizing agent and thus by supplying the solvent to the entire upper surface of the substrate W, the liquid droplets of the first hydrophobizing agent adhering to the substrate W are replaced by the solvent (second solvent rinsing processing). Then, when the second solvent rinsing processing has been performed for a predetermined time, the controller 22 closes the solvent valve 18 to stop the discharge of the solvent.

After the second solvent rinsing step (S206) has been performed, a second hydrophobization processing (hydrophobizing step, vapor supply step, second hydrophobizing step, second vapor supply step) of supplying the second hydrophobizing agent (vapor) to the substrate W is performed (S207). Specifically, the controller 22 controls the second hydrophobizing agent supply unit 217 to cause the vapor of the second hydrophobizing agent to be discharged from the central axis nozzle 14 toward the central portion of the upper surface of the substrate W with the shielding plate 3 being positioned at the processing position. By the vapor of the second hydrophobizing agent flowing outward along the upper surface of the substrate W, the vapor of the second hydrophobizing agent is supplied to the entire upper surface of the substrate W and the vapor of the second hydrophobizing agent enters into the internal portions of the patterns P. The upper surface of the substrate W is thereby hydrophobized (second hydrophobization processing). Then, when the second hydrophobization processing has been performed for a predetermined time, the controller 22 controls the second hydrophobizing agent supply unit 217 to stop the discharge of the vapor of the second hydrophobizing agent.

Thereafter, a drying processing (drying step, vaporizing step) of drying the substrate W is performed (S208). Specifically, the controller 22 makes the liquid droplets of the second hydrophobizing agent adhering to the upper surface of the substrate W vaporize to thereby dry the substrate W (drying processing). The controller 22 may rotate the substrate W by the spin chuck 2 to make the liquid droplets of the second hydrophobizing agent vaporize by an air flow resulting from the rotation of the substrate W or may make the liquid droplets of the second hydrophobizing agent vaporize naturally while keeping the substrate W still. Also, the controller 22 may make the liquid droplets of the second hydrophobizing agent vaporize while making the transfer robot transfer the substrate W.

The third processing example corresponds to the first processing example described above and the fourth processing example corresponds to the second processing example described above. That is, the substrate W processed by the substrate processing apparatus 201 is, for example, the substrate W having the patterns P of the laminated film 32 formed thereon (see FIG. 7). In the case where the first film 32*a*, the second film 32*b*, and the third film 32*c* are, for example, a silicon-containing film, a silicon-containing film, and a metal film, respectively (see FIG. 8), a silicon hydrophobizing agent or a metal hydrophobizing agent is used as the first hydrophobizing agent in the third processing example. Also, in the case where the first film 32*a*, the second film 32*b*, and the third film 32*c* are, for example, a silicon-containing film, a silicon-containing film, and a metal film, respectively (see FIG. 8), for example, a metal hydrophobizing agent is used as the first hydrophobizing agent and a silicon hydrophobizing agent is used as the second hydrophobizing agent in the fourth processing example. The same applies to other combinations of the first film 32*a*, the second film 32*b*, and the third film 32*c*.

As described above, with the second embodiment, the vapor of the hydrophobizing agent is supplied to the substrate W in both the third processing example and the fourth processing example. A portion of the vapor of the hydrophobizing agent supplied to the substrate W changes to liquid droplets and adheres to the substrate W. However, the liquid droplets of the hydrophobizing agent vaporize and are removed from the substrate W in a short time. The hydrophobizing agent thus does not have to be rinsed off by a solvent as in the first processing example and the second processing example. That is, the pre-drying rinsing processing does not have to be performed. The processing time for the substrate W can thereby be shortened.

Also, in the fourth processing example, the second solvent rinsing processing is performed after performing the first hydrophobization processing and before performing the second hydrophobization processing. If at the end of the first hydrophobization processing, the substrate W dries due to the liquid droplets of the first hydrophobizing agent vaporizing from the substrate W, the patterns P may collapse due to insufficient lowering of the hydrophobicity of the substrate W. The substrate W is thus prevented from drying by performing the second solvent rinsing processing of supplying the solvent to the substrate W before the liquid droplets of the first hydrophobizing agent are removed by vaporization. By thereafter supplying the vapor of the second hydrophobizing agent, the solvent adhering to the substrate W is replaced by the second hydrophobizing agent and the second hydrophobization processing is performed.

Also, in the third processing example and the fourth processing example, the state in which pure water does not contact the substrate W is maintained until the substrate W has been dried after having been hydrophobized (from the end of the first hydrophobization processing to the end of the drying processing). The hydrophobicity of the substrate W is thus prevented from significantly decreasing in the case where an amine having the hydrophobic group, which is an example of a metal hydrophobizing agent, is supplied to the substrate W that includes a metal film. Collapse of the patterns P can thereby be suppressed or prevented.

Also, by maintaining the state in which pure water does not contact the substrate W until the substrate W has been dried after having been hydrophobized, formation of watermarks can be suppressed or prevented.

Third Embodiment

Figure 21:
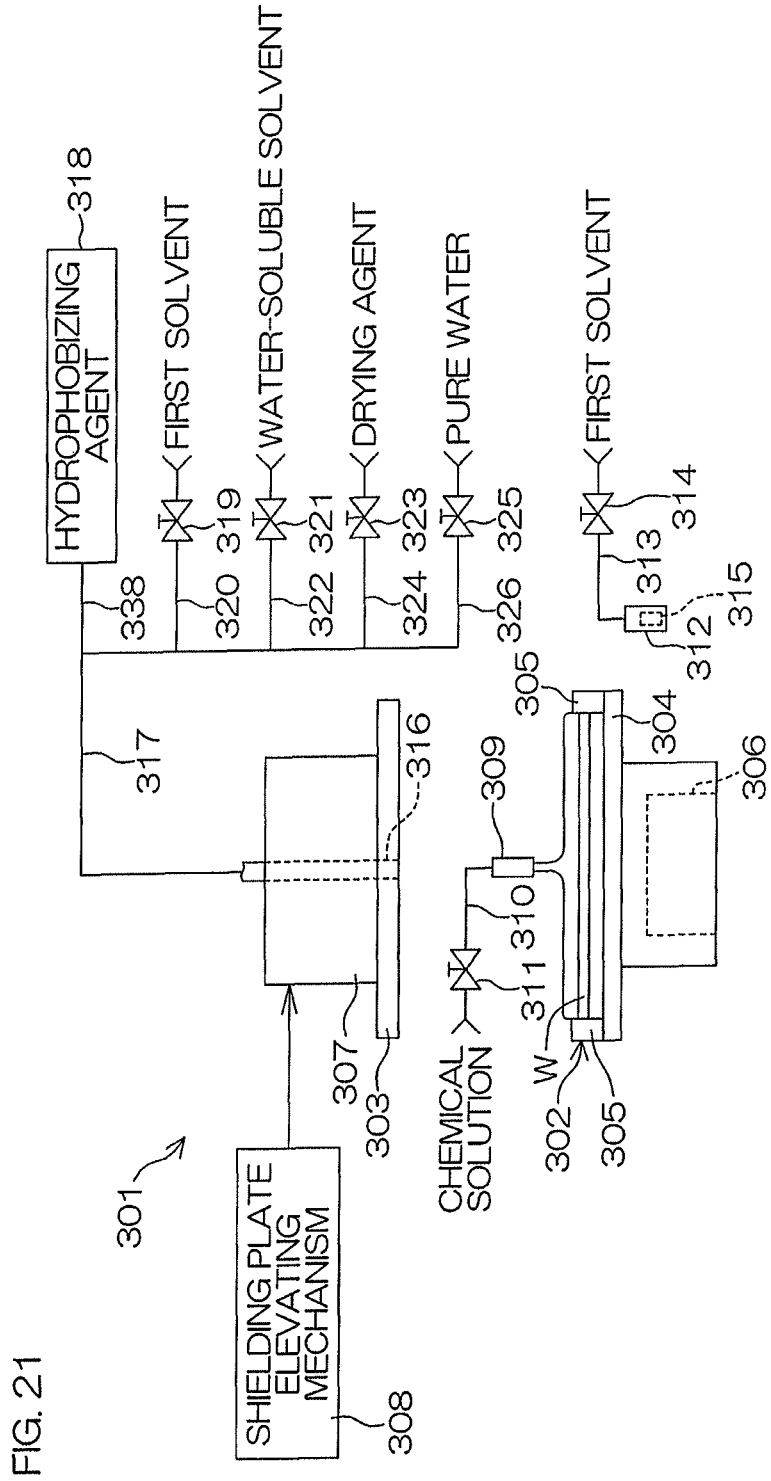
FIG. 21 is a schematic view of a general arrangement of a substrate processing apparatus according to a third embodiment of the present invention.
Figure 22:
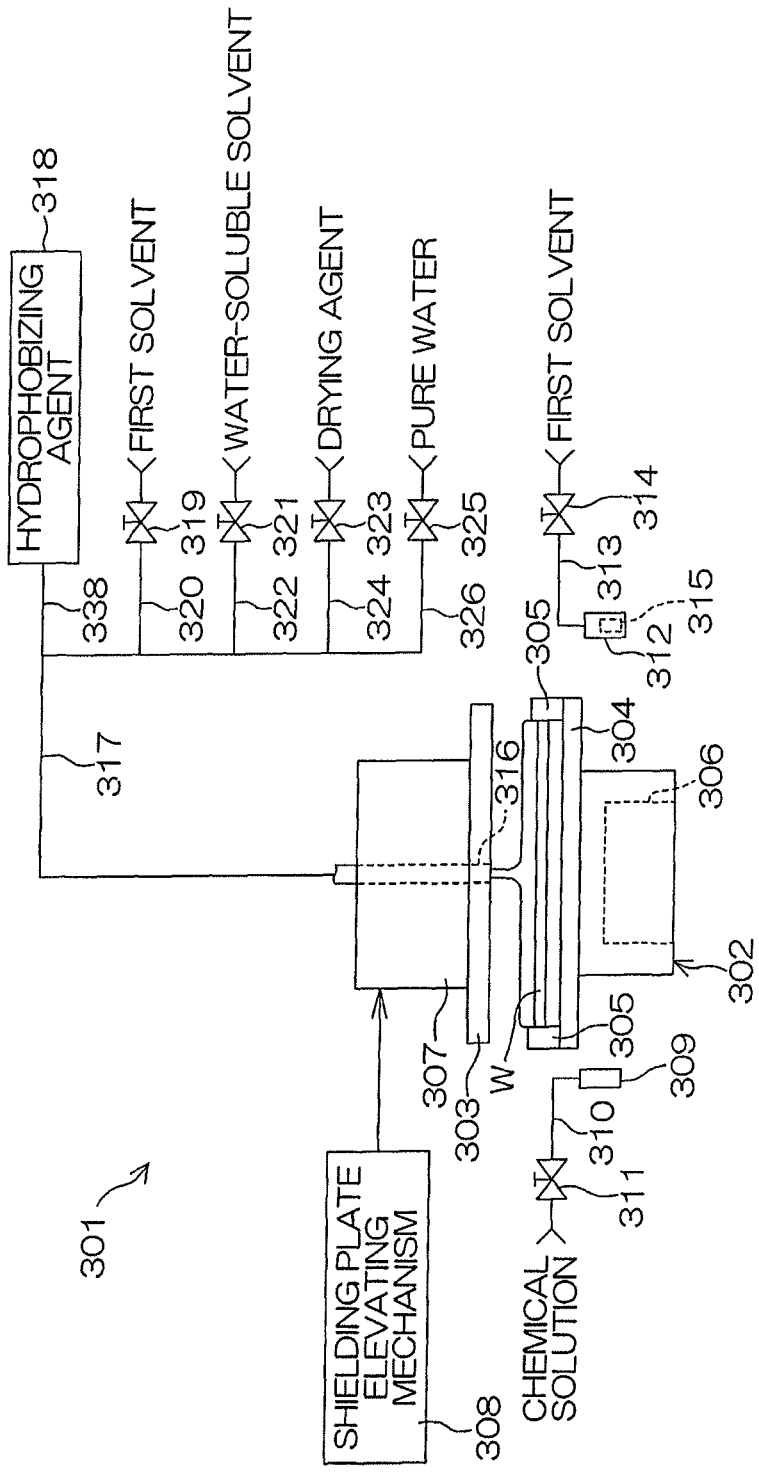
FIG. 22 is a schematic view of the general arrangement of the substrate processing apparatus according to the third embodiment of the present invention.

FIG. 21 and FIG. 22 are schematic views of a general arrangement of a substrate processing apparatus 301 according to a third embodiment of the present invention, with each figure showing a different state.

The substrate processing apparatus 301 is a single substrate processing type substrate processing apparatus that processes a semiconductor wafer or other substrate W one at a time by a chemical solution, a rinsing liquid, and other processing liquids. The substrate processing apparatus 301 includes a spin chuck 302 (substrate holding unit) that horizontally holds and rotates the substrate W, a shielding plate 303 disposed above the spin chuck 302, and a processing liquid supply mechanism that supplies the processing liquids to the substrate W held by the spin chuck 302.

The spin chuck 302 is, for example, a gripping type chuck that grips and holds the substrate W. The spin chuck 302 includes, for example, a disk-shaped spin base 304 that is disposed horizontally, a plurality of gripping members 305 disposed on the spin base 304, and a spin motor 306 (drying unit) coupled to the spin base 304. The spin chuck 302 can grip the substrate W from the periphery by putting the respective gripping members 305 in contact with the peripheral end surface of the substrate W. Further, the spin chuck 302 can rotate the substrate W about the vertical rotational axis passing through a center of the substrate W by imparting a driving force of the spin motor 306 to the spin base 304 while holding the substrate W. The spin chuck 302 is not restricted to a gripping type chuck and may be a vacuum type chuck that suctions and holds a lower surface (rear surface) of the substrate W.

Also, the shielding plate 303 has, for example, a disk shape. A diameter of the shielding plate 303 is, for example, substantially the same as the diameter of the substrate W or slightly greater than the diameter of the substrate W. The shielding plate 303 is disposed so that a lower surface of the shielding plate 303 is horizontal. Further, the shielding plate 303 is disposed so that a central axis of the shielding plate 303 is positioned along the rotational axis of the spin chuck 302. The lower surface of the shielding plate 303 faces the upper surface of the substrate W held by the spin chuck 302. The shielding plate 303 is coupled in the horizontal posture to a lower end of a support shaft 307. The shielding plate 303 and the support shaft 307 are raised and lowered in the vertical direction by a shielding plate elevating mechanism 308. The shielding plate elevating mechanism 308 raises and lowers the shielding plate 303 between a processing position (position shown in FIG. 22) at which the lower surface of the shielding plate 303 is set close to the upper surface of the substrate W held by the spin chuck 302 and a retreat position (position shown in FIG. 21) set above the processing position.

The processing liquid supply mechanism includes a chemical solution nozzle 309, a chemical solution supply pipe 310, and a chemical solution valve 311. The chemical solution supply pipe 310 is connected to the chemical solution nozzle 309. The chemical solution valve 311 is interposed in the chemical solution supply pipe 310. When the chemical solution valve 311 is opened, a chemical solution is supplied from the chemical solution supply pipe 310 to the chemical solution nozzle 309. Also, when the chemical solution valve 311 is closed, the supply of the chemical solution from the chemical solution supply pipe 310 to the chemical solution nozzle 309 is stopped. The chemical solution nozzle 309 is coupled to a nozzle moving mechanism (not shown). The nozzle moving mechanism moves the chemical solution nozzle 309 between a processing position (position shown in FIG. 21) set above the spin chuck 302 and a retreat position (position shown in FIG. 22) at which the chemical solution nozzle 309 is retracted from above the spin chuck 302. The processing position is set so that the chemical solution discharged from the chemical solution nozzle 309 is supplied to the central portion of the upper surface of the substrate W held by the spin chuck 302 (see FIG. 21).

Also, the processing liquid supply mechanism includes a solvent nozzle 312 (first solvent supply unit), a first solvent supply pipe 313, a first solvent valve 314, and an ultrasonic transducer 315 (physical force applying unit, vibration applying unit). The first solvent supply pipe 313 is connected to the solvent nozzle 312. The first solvent valve 314 is interposed in the first solvent supply pipe 313. When the first solvent valve 314 is opened, a first solvent (liquid) is supplied from the first solvent supply pipe 313 to the solvent nozzle 312. Also, when the first solvent valve 314 is closed, the supply of the first solvent from the first solvent supply pipe 313 to the solvent nozzle 312 is stopped. Vibration of the ultrasonic transducer 315 is applied to the first solvent discharged from the solvent nozzle 312. The solvent nozzle 312 is coupled to a nozzle moving mechanism (not shown). The nozzle moving mechanism moves the solvent nozzle 312 between a processing position set above the spin chuck 302 and a retreat position (position shown in FIG. 21 and FIG. 22) at which the solvent nozzle 312 is retracted from above the spin chuck 302. The processing position is set so that the first solvent discharged from the solvent nozzle 312 is supplied to the central portion of the upper surface of the substrate W held by the spin chuck 302.

Also, the processing liquid supply mechanism includes a central axis nozzle 316 (rinsing liquid supply unit, first solvent supply unit, hydrophobizing agent supply unit, water-soluble solvent supply unit, non-contact state maintaining unit, drying agent supply unit) and a processing liquid supply pipe 317. The central axis nozzle 316 is disposed along the central axis of the shielding plate 303. The central axis nozzle 316 extends vertically in an interior of the support shaft 307. The central axis nozzle 316 is raised and lowered along with the shielding plate 303 and the support shaft 307. The processing liquid supply pipe 317 is connected to the central axis nozzle 316 above the shielding plate 303. For example, a hydrophobizing agent, the first solvent, a water-soluble solvent, a drying agent, a rinsing liquid, and other processing liquids are supplied from the processing liquid supply pipe 317 to the central axis nozzle 316. The processing liquid supplied to the central axis nozzle 316 is discharged downward from a discharge port disposed at a lower end of the central axis nozzle 316. The processing liquid discharged from the central axis nozzle 316 passes through a through-hole (not shown) that passes vertically through a central portion of the shielding plate 303 and is discharged downward from a central portion of the lower surface of the shielding plate 303 as shown in FIG. 22. The processing liquid is thereby supplied to the central portion of the upper surface of the substrate W.

The processing liquid supply mechanism includes a hydrophobizing agent supply unit 318, a second solvent supply pipe 320 having a second solvent valve 319 interposed therein, a water-soluble solvent supply pipe 322 having a water-soluble solvent valve 321 interposed therein, a drying agent supply pipe 324 having a drying agent valve 323 interposed therein, and a rinsing liquid supply pipe 326 having a rinsing liquid valve 325 interposed therein. The processing liquid supply pipe 317 is connected to the hydrophobizing agent supply unit 318, the second solvent supply pipe 320, the rinsing liquid supply pipe 326, and the drying agent supply pipe 324. The hydrophobizing agent (liquid) is supplied from the hydrophobizing agent supply unit 318 to the processing liquid supply pipe 317. Also, when the second solvent valve 319 is opened, the first solvent (liquid) is supplied from the second solvent supply pipe 320 to the processing liquid supply pipe 317. Also, when the water-soluble solvent valve 321 is opened, a water-soluble solvent (liquid) is supplied from the water-soluble solvent supply pipe 322 to the processing liquid supply pipe 317. Also, when the drying agent valve 323 is opened, a drying agent (liquid) is supplied from the drying agent supply pipe 324 to the processing liquid supply pipe 317. Also, when the rinsing liquid valve 325 is opened, a rinsing liquid (pure water in FIG. 21 and FIG. 22) is supplied from the rinsing liquid supply pipe 326 to the processing liquid supply pipe 317.

The rinsing liquid is a liquid that contains water. The rinsing liquid is, for example, any of pure water, carbonated water, electrolyzed ion water, hydrogen water, ozone water, or aqueous hydrochloric acid of dilute concentration (for example, about 10 to 100 ppm).

The hydrophobizing agent is a metal hydrophobizing agent that hydrophobizes a metal. The hydrophobizing agent is a hydrophobizing agent of a high degree of coordination. That is, the hydrophobizing agent is a solvent that hydrophobizes a metal mainly by coordination bonds. The hydrophobizing agent contains, for example, at least one of an amine having a hydrophobic group and an organosilicon compound.

The first solvent is a liquid that does not contain a hydroxyl group. That is, the first solvent is a solvent made of a compound that does not contain a hydroxyl group. The first solvent is capable of dissolving the hydrophobizing agent. The first solvent does not contain water and is preferably lower in surface tension than water. The first solvent is a ketone type solvent or an ether type solvent. PGMEA and acetone can be cited as specific examples of the first solvent. The ketone type or ether type solvent is high in solubility of the hydrophobizing agent, and when the hydrophobizing agent is mixed in the ketone type or ether type solvent, the hydrophobizing agent disperses sufficiently in the ketone type or ether type solvent. On the other hand, an alcohol type solvent is low in solubility of the hydrophobizing agent, and even if the hydrophobizing agent is mixed in an alcohol type solvent, the hydrophobizing agent does not disperse sufficiently in the alcohol type solvent.

The water-soluble solvent is capable of dissolving water. The water-soluble solvent may contain water. The water-soluble solvent is higher in solubility in water than the first solvent and the second solvent. Put in another way, the water-soluble solvent is higher in water solubility than the first solvent and the second solvent. The first solvent is capable of dissolving the water-soluble solvent. Alcohols, PGMEA, EGMEA, and mixed solutions of a fluorine-based solvent and an alcohol can be cited as specific examples of the water-soluble solvent. The alcohol contains, for example, at least one of methyl alcohol, ethanol, propyl alcohol, and IPA. The fluorine-based solvent contains, for example, at least one of an HFE and an HFC.

The drying agent is a solvent that does not contain water. The drying agent is lower in boiling point than water. Further, the drying agent is capable of dissolving the hydrophobizing agent. The drying agent is preferably lower in surface tension than water. Alcohols and mixed solutions of a fluorine-based solvent and an alcohol can be cited as specific examples of the drying agent.

Figure 23:
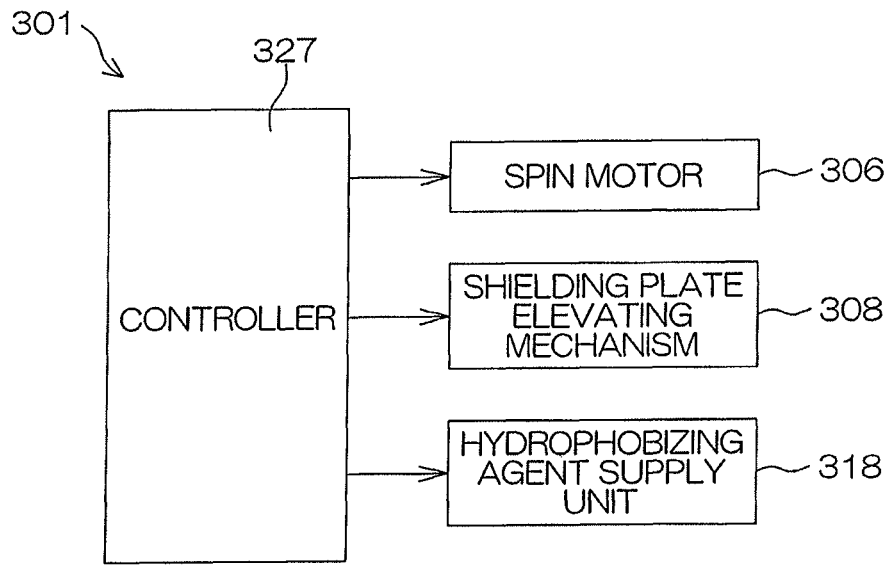
FIG. 23 is a block diagram for describing an electrical arrangement of the substrate processing apparatus according to the third embodiment of the present invention.

FIG. 23 is a block diagram for describing an electrical arrangement of the substrate processing apparatus 301 according to the third embodiment of the present invention.

As shown in FIG. 23, the substrate processing apparatus 301 includes a controller 327 (controller). The spin motor 306, the shielding plate elevating mechanism 308, and the hydrophobizing agent supply unit 318 are controlled by the controller 327. Also, opening and closing of the respective valves included in the substrate processing apparatus 301 are controlled by the controller 327. As shown in FIG. 21, the controller 327 positions the chemical solution nozzle 309 or the solvent nozzle 312 at the processing position and causes a processing liquid to be discharged from the chemical solution nozzle 309 or the solution nozzle 312 in a state where the substrate W is rotated by the spin chuck 302 (a state where a processing liquid is discharged from the chemical solution nozzle 309 is shown in FIG. 21). The processing liquid discharged from the chemical solution nozzle 309 or the solvent nozzle 312 is supplied to the central portion of the upper surface of the substrate W held by the spin chuck 302. The processing liquid supplied to the central portion of the upper surface of the substrate W receives a centrifugal force due to rotation of the substrate W and spreads outward along the substrate W. The processing liquid is thereby supplied to the entire upper surface of the substrate W and the substrate W is processed by the processing liquid.

On the other hand, as shown in FIG. 22, the controller 327 positions the shielding plate 303 at the processing position and causes a processing liquid to be discharged from the central axis nozzle 316 while the substrate W is being rotated by the spin chuck 302. The processing liquid discharged from the central axis nozzle 316 is supplied to the central portion of the upper surface of the substrate W held by the spin chuck 302. The processing liquid supplied to the central portion of the upper surface of the substrate W receives the centrifugal force due to rotation of the substrate W and spreads outward along the substrate W. The processing liquid is thereby supplied to the entire upper surface of the substrate W and the substrate W is processed by the processing liquid. Also, the processing liquid that is shaken off to the periphery of the substrate W is suppressed or prevented from splashing back and adhering to the substrate W because the processing liquid is supplied to the substrate W with the lower surface of the shielding plate 303 being set close to the upper surface of the substrate W.

Figure 24:
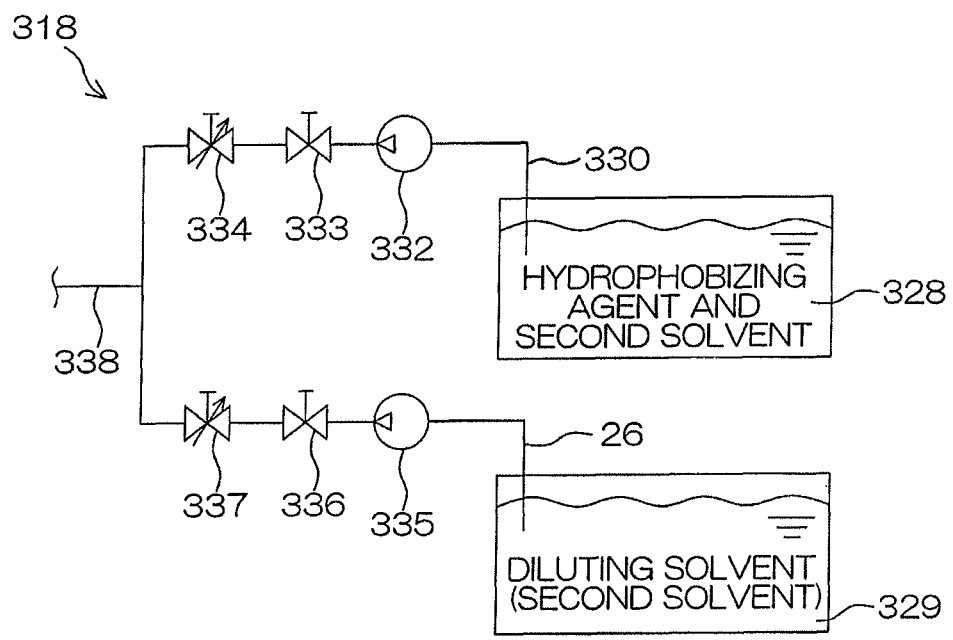
FIG. 24 is a schematic view of a general arrangement of a hydrophobizing agent supply unit according to the third embodiment of the present invention.

FIG. 24 is a schematic view of a general arrangement of the hydrophobizing agent supply unit 318 according to the third embodiment of the present invention.

The hydrophobizing agent supply unit 318 includes a hydrophobizing agent tank 328 storing a stock solution of the hydrophobizing agent and a second solvent tank 329 storing a second solvent (liquid) as a diluting solvent. Further, the hydrophobizing agent supply unit 318 includes a first pipe 330 connected to the hydrophobizing agent tank 328, a second pipe 331 connected to the second solvent tank 329, a first pump 332, a first valve 333 and a first flow regulating valve 334 interposed in the first pipe 330, a second pump 335, a second valve 336, and a second flow regulating valve 337 interposed in the second pipe 331, and a collective pipe 338 connected to the first pipe 330 and the second pipe 331. A mixed solution (stock solution) of 100% hydrophobizing agent and the second solvent is stored in the hydrophobizing agent tank 328.

The stock solution of the hydrophobizing agent stored in the hydrophobizing agent tank 328 is sucked into the first pipe 330 by a suction force of the first pump 332. Likewise, the second solvent stored in the second solvent tank 329 is sucked into the second pipe 331 by a suction force of the second pump 335. The stock solution of the hydrophobizing agent stored in the hydrophobizing agent tank 328 may instead be supplied into the first pipe 330 by raising an air pressure inside the hydrophobizing agent tank 328 by supplying a gas into the hydrophobizing agent tank 328. The same applies to the second solvent stored in the second solvent tank 329. The collective pipe 338 is connected to the processing liquid supply pipe 317 (see FIG. 21 and FIG. 22). Opening degrees of the first flow regulating valve 334 and the second flow regulating valve 337 are controlled by the controller 327. The controller 327 controls the opening degrees of the first flow regulating valve 334 and the second flow regulating valve 337 so that the stock solution of the hydrophobizing agent and the second solvent are supplied, for example, at fixed proportions to the collective pipe 338. A hydrophobizing agent (mixed solution of the hydrophobizing agent stock solution and the second solvent) of a fixed concentration is thus supplied to the processing liquid supply pipe 317.

The second solvent is a liquid that does not contain a hydroxyl group. That is, the second solvent is a solvent made of a compound that does not contain a hydroxyl group. The second solvent is capable of dissolving the hydrophobizing agent. The second solvent does not contain water and is preferably lower in surface tension than water. The second solvent is a ketone type solvent or an ether type solvent. PGMEA and acetone can be cited as specific examples of the second solvent. The second solvent may be the same type of solvent as the first solvent or may be a different type of solvent from the first solvent.

When the controller 327 opens the first valve 333, the hydrophobizing agent stock solution stored in the hydrophobizing agent tank 328 is supplied to the collective pipe 338 at a flow rate in accordance with the opening degree of the first flow regulating valve 334. Likewise, when the controller 327 opens the second valve 336, the second solvent stored in the second solvent tank 329 is supplied to the collective pipe 338 at a flow rate in accordance with the opening degree of the second flow regulating valve 337. The hydrophobizing agent stock solution and the second solvent are thereby mixed inside the collective pipe 338. The hydrophobizing agent stock solution thus dissolves in the second solvent and the hydrophobizing agent stock solution is diluted. The diluted hydrophobizing agent stock solution, that is, the hydrophobizing agent is supplied from the collective pipe 338 to the processing liquid supply pipe 317 and is discharged from the central axis nozzle 316. That is, the hydrophobizing agent stock solution and the second solvent are mixed in a flow path of the hydrophobizing agent leading from the hydrophobizing agent tank 328 to the substrate W held by the spin chuck 302, and the hydrophobizing agent stock solution and the second solvent that are mixed are supplied to the substrate W. The first pipe 330, the collective pipe 338, the processing liquid supply pipe 317, and the central axis nozzle 316 thus make up a portion of the flow path of the hydrophobizing agent.

Figure 25:
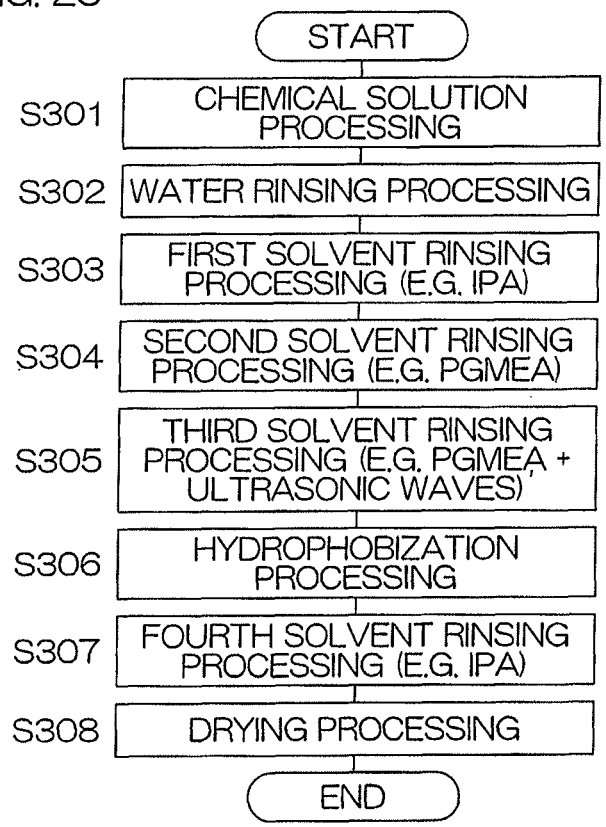
FIG. 25 is a process chart for describing a processing example of processing a substrate by the substrate processing apparatus according to the third embodiment of the present invention.

FIG. 25 is a process chart for describing a processing example of processing a substrate W by the substrate processing apparatus 301 according to the third embodiment of the present invention. The processing example of processing the substrate W having patterns P (see FIG. 26) formed on the front surface, which is the device forming surface, shall be described below. The patterns P include, for example, a plurality of cylinders (recess portions) formed by metal films M (see FIG. 26). The cylinders S form electrodes of a capacitor provided in a DRAM (dynamic random access memory). Each cylinder S forms a bottomed cylindrical recess portion that is recessed in a thickness direction of the substrate W. In the following description, "upper surface (front surface) of the substrate W" includes the upper surface (front surface) of the substrate W itself and surfaces of the patterns P.

An unprocessed substrate W is transferred by an unillustrated transfer robot and is placed on the spin chuck 302, for example, with the front surface that is the device forming surface faced upward. The controller 327 then makes the spin chuck 302 hold the substrate W. When the substrate W is being transferred onto the spin chuck 302, the controller 327 positions the chemical solution nozzle 309, the solvent nozzle 312, and the shielding plate 303 at the respective retreat positions to prevent the transfer robot and the substrate W from colliding with the chemical solution nozzle 309, the solvent nozzle 312, and the shielding plate 303.

Thereafter, a chemical solution processing of supplying the chemical solution to the substrate W is performed (S301). Specifically, the controller 327 makes the chemical solution nozzle 309 move from the retreat position to the processing position with the shielding plate 303 being positioned at the retreat position. Also, the controller 327 controls the spin motor 306 to rotate the substrate W held by the spin chuck 302. The controller 327 then opens the chemical solution valve 311 to cause the chemical solution to be discharged from the chemical solution nozzle 309 toward the central portion of the upper surface of the substrate W while making the substrate W rotate by the spin chuck 302. The chemical solution is thereby supplied to the entire upper surface of the substrate W and the substrate W is processed by the chemical solution (chemical solution processing). Then, when the chemical solution processing has been performed for a predetermined time, the controller 327 closes the chemical solution valve 311 to stop the discharge of the chemical solution. Thereafter, the controller 327 makes the chemical solution nozzle 309 move to the retreat position.

Thereafter, a water rinsing processing (rinsing liquid supply step) of supplying pure water, which is an example of a rinsing liquid, to the substrate W is performed (S302). Specifically, the controller 327 controls the shielding plate elevating mechanism 308 to move the shielding plate 303 from the retreat position to the processing position with the chemical solution nozzle 309 being positioned at the retreat position. The controller 327 then opens the rinsing liquid valve 325 to cause pure water to be discharged from the central axis nozzle 316 toward the central portion of the upper surface of the substrate W while making the substrate W rotate by the spin chuck 302. The chemical solution held by the substrate W is thereby replaced by the pure water, and the pure water is supplied to the entire upper surface of the substrate W. The chemical solution adhering to the substrate W is thereby rinsed off by the pure water (water rinsing processing). Then, when the water rinsing processing has been performed for a predetermined time, the controller 327 closes the rinsing liquid valve 325 to stop the discharge of pure water.

Thereafter, a first solvent rinsing processing (water-soluble solvent supply step) of supplying IPA, which is an example of a water-soluble solvent, to the substrate W is performed (S303). Specifically, the controller 327 opens the water-soluble solvent valve 321 to cause IPA to be discharged from the central axis nozzle 316 toward the central portion of the upper surface of the substrate W while positioning the shielding plate 303 at the processing position and further making the substrate W rotate by the spin chuck 302. The IPA discharged from the central axis nozzle 316 is thereby supplied to the entire upper surface of the substrate W. A large portion of the pure water held by the substrate W is rinsed off by the IPA. Also, IPA is capable of dissolving water, and thus a portion of the pure water held by the substrate W dissolves into the IPA and is removed (discharged) from the substrate W together with the IPA. The pure water is thus removed from the substrate W and the pure water held by the substrate W is replaced by the IPA (first solvent rinsing processing). Then, when the first solvent rinsing processing has been performed for a predetermined time, the controller 327 closes the water-soluble solvent valve 319 to stop the discharge of IPA. By performing the first solvent rinsing processing, water is removed from the substrate W and a residual amount of water on the substrate W is reduced.

Thereafter, a second solvent rinsing processing (first solvent supply step, replacement step) of supplying PGMEA, which is an example of the first solvent, to the substrate W is performed (S304). Specifically, the controller 327 opens the second solvent valve 319 to cause PGMEA to be discharged from the central axis nozzle 316 toward the central portion of the upper surface of the substrate W while positioning the shielding plate 303 at the processing position and further making the substrate W rotate by the spin chuck 302. The PGMEA discharged from the central axis nozzle 316 is thereby supplied to the entire upper surface of the substrate W. As mentioned above, the first solvent is capable of dissolving the water-soluble solvent and thus the IPA held by the substrate W dissolves into the PGMEA supplied to the substrate W and is removed (discharged) from the substrate W together with the PGMEA. Thus, by supplying PGMEA, the IPA held by the substrate W is rinsed off by the PGMEA and replaced by the PGMEA (second solvent rinsing processing). Then, when the second solvent rinsing processing has been performed for a predetermined time, the controller 327 closes the second solvent valve 319 to stop the discharge of PGMEA. Even if pure water remains on the substrate W or pure water is dissolved in the IPA held by the substrate W after the first solvent rinsing processing has been performed, the residual amount of water on the substrate W is further reduced by performing the second solvent rinsing processing.

Thereafter, a third solvent rinsing processing (first solvent supply step, physical replacement step) of applying vibration to PGMEA, which is an example of the first solvent, and supplying the vibration-applied PGMEA to the substrate W is performed (S305). Specifically, the controller 327 controls the shielding plate elevating mechanism 308 to move the shielding plate 303 from the processing position to the retreat position. Thereafter, the controller 327 moves the solvent nozzle 312 from the retreat position to the processing position. The controller 327 then opens the first solvent valve 314 to cause PGMEA to be discharged from the solvent nozzle 312 toward the central portion of the upper surface of the substrate W while making the substrate W rotate by the spin chuck 302. The PGMEA, to which vibration is applied by the ultrasonic transducer 315, is thereby supplied to the entire upper surface of the substrate W and the PGMEA held by the substrate W is replaced by the PGMEA discharged from the solvent nozzle 312 (third solvent rinsing processing). Vibration is applied to the PGMEA supplied to the substrate W and thus even if pure water is left on the substrate W (for example, at bottom portions of the cylinders S; see FIG. 26), the pure water is stirred by the vibration of the PGMEA and is removed from the substrate W together with the PGMEA. The pure water is thereby removed from the substrate W. Then, when the third solvent rinsing processing has been performed for a predetermined time, the controller 327 closes the first solvent valve 314 to stop the discharge of PGMEA. The residual amount of water on the substrate W is thus further reduced by performing the third solvent rinsing processing.

Thereafter, a hydrophobization processing (hydrophobizing agent supply step) of supplying the hydrophobizing agent (liquid) to the substrate W to hydrophobize the substrate W is performed (S306). Specifically, the controller 327 moves the solvent nozzle 312 from the processing position to the retreat position. Thereafter, the controller 327 controls the shielding plate elevating mechanism 308 to move the shielding plate 303 from the retreat position to the processing position. The controller 327 then controls the hydrophobizing agent supply unit 318 to cause the hydrophobizing agent to be discharged from the central axis nozzle 316 toward the central portion of the upper surface of the substrate W while positioning the shielding plate 303 at the processing position and further making the substrate W rotate by the spin chuck 302. The hydrophobizing agent is thereby supplied to the entire upper surface of the substrate W. The hydrophobizing agent is capable of dissolving the first solvent, and thus by supplying the hydrophobizing agent to the entire upper surface of the substrate W, the PGMEA held by the substrate W is replaced by the hydrophobizing agent. The hydrophobizing agent is thereby made to enter into internal portions of the patterns P and the upper surface of the substrate W is hydrophobized (hydrophobization processing). Then, when the hydrophobization processing has been performed for a predetermined time, the controller 327 controls the hydrophobizing agent supply unit 318 to stop the discharge of the hydrophobizing agent.

Thereafter, a fourth solvent rinsing processing (non-contact state maintaining step, drying agent supply step) of supplying IPA, which is an example of the drying agent, to the substrate W is performed (S307). Specifically, the controller 327 opens the drying agent valve 323 to cause the solvent to be discharged from the central axis nozzle 316 toward the central portion of the upper surface of the substrate W while positioning the shielding plate 303 at the processing position and further making the substrate W rotate by the spin chuck 302. The IPA discharged from the central axis nozzle 316 is thereby supplied to the entire upper surface of the substrate W. A large portion of the hydrophobizing agent held by the substrate W is thus rinsed off by the IPA. Also, IPA is capable of dissolving the hydrophobizing agent, and thus the hydrophobizing agent remaining on the substrate W dissolves into the IPA and is removed (discharged) from the substrate W together with the IPA. The hydrophobizing agent is thereby removed from the substrate W and the hydrophobizing agent held by the substrate W is replaced by the IPA (fourth solvent rinsing processing). Then, when the fourth solvent rinsing processing has been performed for a predetermined time, the controller 327 closes the drying agent valve 323 to stop the discharge of IPA.

Thereafter, a drying processing (drying step) of drying the substrate W is performed (S308). Specifically, the controller 327 controls the spin motor 306 to rotate the substrate W at a high rotation speed (for example, several thousand rpm) with the shielding plate 303 being positioned at the processing position. A large centrifugal force thus acts on the IPA adhering to the substrate W and the IPA is shaken off to the periphery of the substrate W. The IPA is thereby removed from the substrate W and the substrate W is dried (drying processing). After the drying processing has been performed for a predetermined time, the controller 327 controls the spin motor 306 to stop the rotation of the substrate W by the spin chuck 302. Further, the controller 327 controls the shielding plate elevating mechanism 308 to move the shielding plate 303 from the processing position to the retreat position. Thereafter, the substrate W that has been processed is carried out from the spin chuck 302 by the transfer robot.

Figure 26:
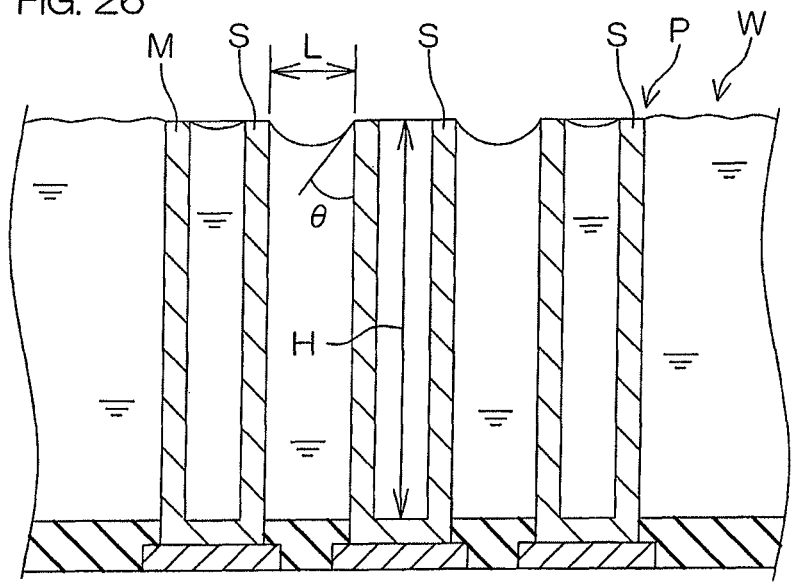
FIG. 26 is a schematic sectional view of a substrate for describing a force applied to patterns.

FIG. 26 is a schematic sectional view of a substrate W for describing a force applied to the patterns P.

When the substrate W with the patterns P formed thereon is dried, a force that draws the patterns P toward each other is applied as the substrate W dries and the patterns P may thereby collapse. The force F applied to the patterns P is expressed, for example, by the following formula (1).

$$F = (2 \times \sigma \times H \cos \theta)/L \qquad \text{(Formula 1)}$$

"σ" is the surface tension of the processing liquid, "θ" is the contact angle, "H" is the height of the patterns P, and "L" is the interval between the patterns P.

From the formula (1), it can be understood that the lower the surface tension σ of the processing liquid, the less the force F applied to the patterns P. Thus, by lowering the surface tension σ of the processing liquid, the force F applied to the patterns P can be decreased to thereby suppress collapse of the patterns P.

It can also be understood from the formula (1) that the force F applied to the patterns P decreases the closer the contact angle θ is to 90 degrees. Thus, by hydrophobizing the surface of the substrate W and thereby making the contact angle θ approach 90 degrees, collapse of the patterns P can be suppressed or prevented.

That is, the collapse of the patterns P can be suppressed by lowering the surface tension σ of the processing liquid held by the substrate W before the substrate W is dried and further by making the contact angle θ approach 90 degrees. It is thus preferable to sufficiently hydrophobize the entire surface of the substrate W to sufficiently suppress the collapse of the patterns P.

Figure 27:
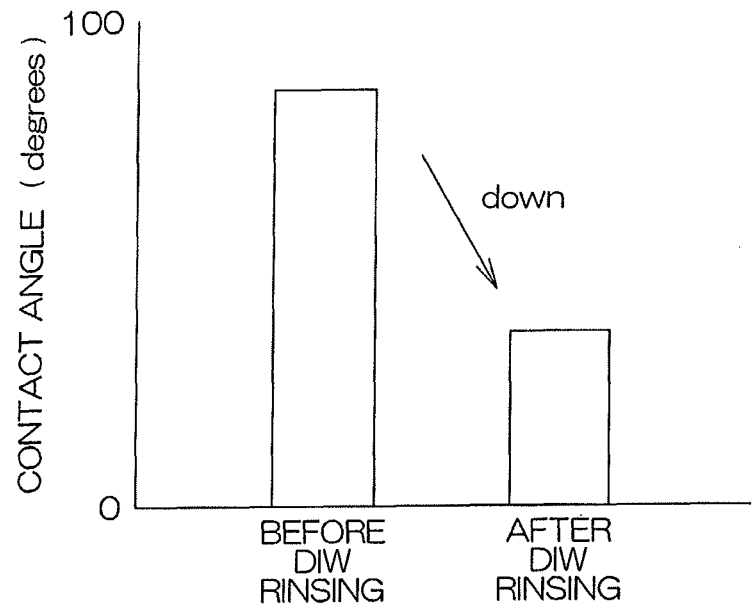
FIG. 27 is a graph of contact angles of a processing liquid with respect to a substrate, hydrophobized by a hydrophobizing agent, before and after pure water is supplied to the substrate.
Figure 28:
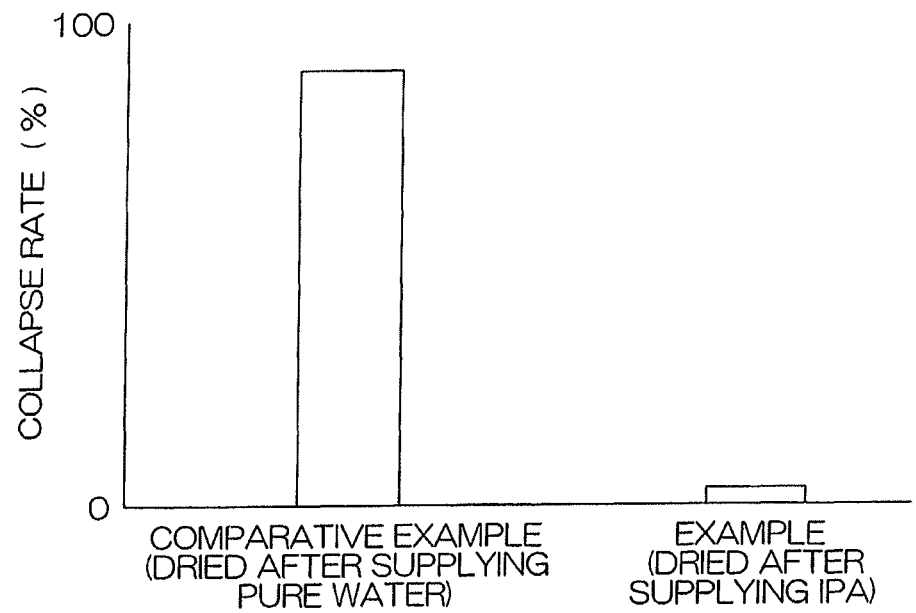
FIG. 28 is a graph of pattern collapse rates when a substrate, hydrophobized by a hydrophobizing agent, is dried after supplying pure water or IPA to the substrate.

FIG. 27 is a graph of contact angles of a processing liquid with respect to a substrate W, hydrophobized by hydrophobizing agent, before and after pure water is supplied to the substrate W. FIG. 28 is a graph of collapse rates of patterns P when a substrate W, hydrophobized by a hydrophobizing agent, is dried after supplying pure water or IPA to the substrate W. The collapse rate of a comparative example shown in FIG. 28 is the value in a case of use of pure water in place of the drying agent in the fourth solvent rinsing processing in the processing example of FIG. 25. On the other hand, the collapse rate of an example shown in FIG. 28 is the value in the case of use of IPA, which is an example of a drying agent, in the fourth solvent rinsing processing in the processing example of FIG. 25.

As can be understood from a comparison of the two contact angles shown in FIG. 27, when pure water is supplied to the substrate W that has been hydrophobized by the hydrophobizing agent (metal hydrophobizing agent), the contact angle of the processing liquid with respect to the substrate W decreases. As mentioned above, the force applied to the patterns P increases as the contact angle θ approaches 0 degrees. Thus, as shown in FIG. 28, in the case of supplying pure water to the substrate W that has been hydrophobized by the hydrophobizing agent and thereafter drying the substrate W (comparative example), the collapse rate of the patterns P is extremely large in comparison to the case of supplying IPA, which is an example of a drying agent (example). In other words, by supplying the drying agent to the substrate W that has been hydrophobized by the hydrophobizing agent and thereafter drying the substrate W, the collapse rate of the patterns P can be reduced significantly in comparison to the case of supplying pure water. Further, IPA is lower in surface tension than water and thus in comparison to the case of drying the substrate W that holds pure water, the collapse rate of the patterns P is reduced significantly.

Figure 29:
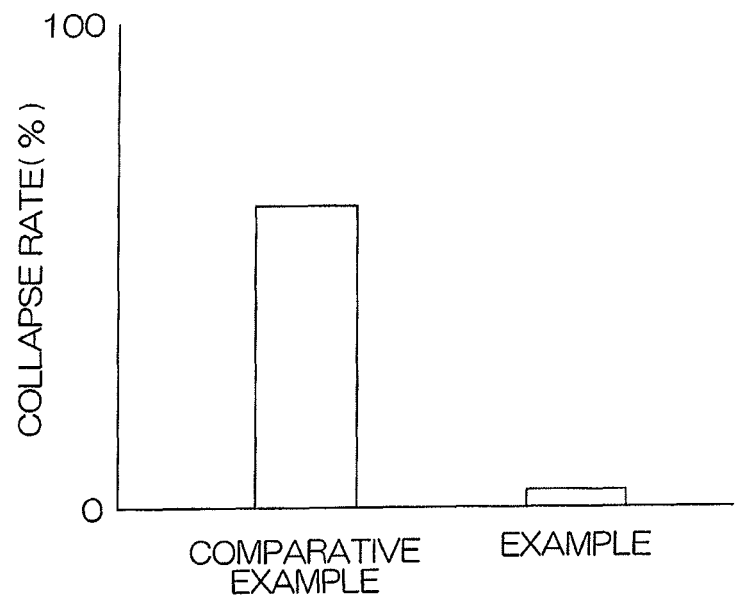
FIG. 29 is a graph of the pattern collapse rate of a substrate processed by a conventional processing method and the pattern collapse rate of a substrate processed by the processing example of FIG. 25.

FIG. 29 is a graph of the collapse rate of patterns P when a substrate W is processed by a conventional substrate processing method and the collapse rate of patterns P when a substrate W is processed by the processing example of FIG. 25. That is, the collapse rate of a comparative example shown in FIG. 29 is the value in a case of drying a substrate W after successively supplying a chemical solution, pure water, and IPA to the substrate W. On the other hand, the collapse rate of an example shown in FIG. 29 is the value obtained upon performing the series of processing of FIG. 25. As shown by the comparative example in FIG. 29, with the conventional substrate processing method, the collapse rate is high (approximately 60%) because the substrate W is not hydrophobized and the force applied to the patterns P is large. On the other hand, in the case where the substrate W is hydrophobized sufficiently as in the example in FIG. 29, the collapse rate is low (approximately 5%) because the force applied to the patterns P is small. Thus, by performing the series of processing of FIG. 25, the collapse rate of the patterns P can be reduced significantly in comparison to the conventional substrate processing method.

As described above, with the third embodiment, after the rinsing liquid that contains water has been supplied to the substrate W, the water-soluble solvent and the first solvent are successively supplied in that order to the substrate W. Thereafter, the first solvent with vibration applied thereto is supplied to the substrate W. By supplying the water-soluble solvent, the rinsing liquid held by the substrate W is removed from the substrate W as it dissolves into the water-soluble solvent. Also, the first solvent is supplied after the water-soluble solvent has been supplied, and thus even if the rinsing liquid remains on the substrate W, the rinsing liquid is removed from the substrate W together with the water-soluble solvent in the process of replacement of the water-soluble solvent by the first solvent. Further, the first solvent with vibration applied thereto is supplied after the first solvent has been supplied first, and thus even if the rinsing liquid remains on the substrate W, the rinsing liquid is removed from the substrate W by the vibration of the first solvent in addition to the force of flow of the first solvent along the substrate W. In a case where a recess portion having a bottomed cylindrical shape is formed on the substrate W, the rinsing liquid readily remains on the substrate (especially at a bottom of the recess portion). However, by supplying the water-soluble solvent and the first solvent to the substrate W as described above, the rinsing liquid can be removed even from the bottom of the recess portion. The residual amount of water on the substrate W can thus be reduced extremely.

The hydrophobizing agent is supplied to the substrate W after supplying the water-soluble solvent and the first solvent to the substrate W. The hydrophobizing agent is thus supplied to the substrate W in a state where the rinsing liquid is not left on the substrate W or in a state in which the residual amount of water is extremely low. Lowering of the ability of the hydrophobizing agent (the ability to hydrophobize the substrate W) due to contact with water can thus be suppressed or prevented. Further, the hydrophobizing agent is supplied to the substrate W holding the first solvent that does not contain a hydroxyl group, and the lowering of the ability of the hydrophobizing agent due to contact with the first solvent can thus be suppressed or prevented. Yet further, the second solvent that does not contain a hydroxyl group is contained in the hydrophobizing agent and thus the hydrophobizing agent can be stabilized and the lowering of the ability of the hydrophobizing agent can be suppressed or prevented. The substrate W can thus be hydrophobized sufficiently by supplying the hydrophobizing agent to the substrate W. That is, the contact angle of the processing liquid with respect to the substrate W can be made to approach 90 degrees to suppress the collapse of the patterns P. Moreover with the processing example described above, the second solvent contained in the hydrophobizing agent is a solvent of the same type as the first solvent and the compatibility of the two is high. The first solvent held by the substrate W is thus replaced smoothly by the hydrophobizing agent. Time required for replacement from the first solvent to the hydrophobizing agent can thus be shortened.

Also, in the third embodiment, the drying agent is supplied to the substrate W after the hydrophobizing agent has been supplied to the substrate W. Thereafter, the drying agent is removed from the substrate W and the substrate W dries. Contact of the substrate W with water is prevented from the end of supply of the hydrophobizing agent to the end of drying of the substrate W. That is, a liquid or vapor containing water is not supplied to the substrate W from the end of supply of the hydrophobizing agent to the end of drying of the substrate W. The contact angle of the processing liquid with respect to the substrate W, to which the hydrophobizing agent has been supplied, can thus be suppressed or prevented from decreasing due to the contact of the substrate W with water. Increase in the force that collapses the patterns P when the substrate W is dried can thereby be suppressed or prevented. The collapse of the patterns P can thus be suppressed or prevented. Further, the drying agent is lower in surface tension than water and thus the collapse of the patterns P can be further suppressed or prevented. Moreover, the drying agent is lower in boiling point than water and thus time required for drying the substrate W can be shortened.

Also, in the third embodiment, the second solvent and the hydrophobizing agent stock solution are mixed inside the collective pipe 338. That is, the second solvent and the hydrophobizing agent stock solution are mixed immediately before being supplied to the substrate W. The mixed solution (hydrophobizing agent) of the second solvent and the hydrophobizing agent stock solution that are mixed is supplied to the substrate W. The second solvent and the hydrophobizing agent stock solution are mixed immediately before being supplied to the substrate W and thus even in a case where the activity of the hydrophobizing agent decreases with the elapse of time due to dilution of the hydrophobizing agent, the hydrophobizing agent that is not decreased in activity or is hardly decreased in activity can be supplied to the substrate W. The substrate W can thus be hydrophobized sufficiently. The collapse of the patterns P can thus be suppressed or prevented.

Other Embodiments

Although the embodiments of the present invention have been described above, the present invention is not restricted to the contents of the above-described embodiments and various modifications are possible within the scope of the claims.

For example, with the first processing example and the second processing example, the case where the solvent is supplied to the substrate W in the pre-drying rinsing processing was described. However, pure water may be supplied to the substrate W in the pre-drying rinsing processing instead.

Specifically, in a case where both the first hydrophobizing agent and the second hydrophobizing agent are hydrophobizing agents besides an amine having a hydrophobic group that is an example of a metal hydrophobizing agent, the hydrophobicity of the substrate W does not decrease significantly even when pure water is supplied to the hydrophobized substrate W and thus pure water may be supplied to the substrate W in the pre-drying rinsing processing. On the other hand, in a case where either the first hydrophobizing agent or the second hydrophobizing agent is an amine having a hydrophobic group, it is preferable to supply a solvent in the pre-drying rinsing processing because the hydrophobicity of the substrate W decreases significantly when pure water is supplied to the substrate W in the pre-drying rinsing processing.

Also, with each of the first processing example to the fourth processing example, the case where a solvent is supplied to the substrate W in the first solvent rinsing processing, the second solvent rinsing processing, and the pre-drying rinsing processing was described. However, a vapor of the solvent may be supplied to the substrate W instead as long as the vapor dissolves sufficiently in the liquid adhering to the substrate W.

Also, with each of the first processing example to the fourth processing example, the case where the first hydrophobization processing of supplying the first hydrophobizing agent to the substrate W is performed after performing the first solvent rinsing processing of supplying the solvent to the substrate W was described. However, in a case where pure water dissolves in the first hydrophobizing agent and the first hydrophobizing agent does not decrease inactivity even upon contact with pure water, the first hydrophobization processing may be performed without performing the first solvent rinsing processing after performing the water rinsing processing of supplying pure water to the substrate W.

Also, with the second processing example, the case where the second solvent rinsing processing of supplying the solvent to the substrate W is performed after performing the first hydrophobization processing and before performing the second hydrophobization processing was described. However, in the case where the first hydrophobizing agent and the second hydrophobizing agent readily mix together, the second hydrophobization processing of supplying the second hydrophobizing agent to the substrate W may be performed without performing the second solvent rinsing processing after performing the first hydrophobization processing of supplying the first hydrophobizing agent to the substrate W.

Also, with each of the first processing example to the fourth processing example, the case where a liquid or a vapor of the hydrophobizing agent that has been diluted to a fixed concentration is supplied to the substrate W in the first hydrophobization processing and the second hydrophobization processing was described. However, the concentration of the hydrophobizing agent may be increased in a continuous or stepwise manner by the controller 22 controlling the opening degrees of the flow regulating valves 28 and 30 (see FIG. 4 and FIG. 18). In this case, the solvent adhering to the substrate W can be replaced smoothly by the hydrophobizing agent in the first hydrophobization processing and the second hydrophobization processing, and thus time required to remove the solvent from the substrate W can be shortened.

Also, with each of the first processing example to the fourth processing example, the case of processing the substrate W by causing the processing liquids to be discharged from the chemical solution nozzle 10 and the central axis nozzle 14 were described. However, the substrate W may instead be processed by making a liquid film of the processing liquid be held on the substrate W. Specifically, a processing liquid is discharged from the chemical solution nozzle 10 or the central axis nozzle 14 while making the substrate W rotate at a low rotation speed of about 10 to 30 rpm by the spin chuck 2 or while stopping the rotation of the substrate W. Then, after a liquid film of the processing liquid that covers the upper surface of the substrate W is formed, the discharge of the processing liquid is stopped. Thereafter, in the state where the discharge of the processing liquid is stopped, the substrate W is processed by the liquid film of the processing liquid while making the substrate W rotate at the low rotation speed or while stopping the rotation of the substrate W.

Also, with each of the first processing example to the fourth processing example, the case where pure water, which is an example of the rinsing liquid, is supplied to the substrate in the water rinsing processing was described. However, the rinsing liquid is not restricted to pure water and a rinsing liquid besides pure water may be supplied to the substrate instead.

Also, with each of the first processing example to the fourth processing example, the case of processing substrate W with the patterns P of the laminated film 32 formed thereon was described. However, a substrate W having patterns P of a single film may also be processed. For example, a substrate W, having patterns P of only an SiN film formed thereon, can be processed as described above using a silicon hydrophobizing agent with a long hydrophobic group or a silicon hydrophobizing agent with a short hydrophobic group in accordance with the second processing example or the fourth processing example to hydrophobize the SiN film sufficiently.

Also, although in each of the second processing example and the fourth processing example, the hydrophobization processing is performed twice using the first hydrophobizing agent and the second hydrophobizing agent, the hydrophobization processing may be performed further for a third time using a third hydrophobizing agent. For example, in the case of the film combination shown in FIG. 10, a hydrophobization processing of the metal film may be preformed using a metal hydrophobizing agent as the first hydrophobizing agent, a hydrophobization processing of the SiN film may be performed using the silicon hydrophobizing agent I with the long hydrophobic group as the second hydrophobizing agent, and further hydrophobization processing of the SiN film may be performed using the silicon hydrophobizing agent II with the short hydrophobic group as the third hydrophobizing agent.

Also, with each of the first processing example to the fourth processing example, the case of processing the substrate W one at a time was described. However, in each of the first processing example to the fourth processing example, a plurality of substrates W may be processed in a batch.

Also, with the third embodiment, the case where the first solvent rinsing processing (water-soluble solvent supply step), the second solvent rinsing processing (replacement step), and the third solvent rinsing processing (physical replacement step) are performed successively after performing the water rinsing processing (rinsing liquid supply step) and before performing the hydrophobization processing (hydrophobizing agent supply step) was described. However, the first solvent rinsing processing and one of the second solvent rinsing processing and the third solvent rinsing processing may be omitted. Or one of the second solvent rinsing processing and the third solvent rinsing processing may be omitted.

Also, with the third embodiment, the case where the liquids of the first solvent, the hydrophobizing agent, the water-soluble solvent, and the drying agent are supplied to the substrate W was described. However, a vapor of the first solvent may be supplied to the substrate W instead. The same applies to the hydrophobizing agent, the water-soluble solvent, and the drying agent. The vapor may be that obtained by gasification of a compound (for example, the first solvent) to be supplied, or may be a mixed fluid containing liquid droplets of the compound to be supplied and a carrier gas (for example, nitrogen gas or other inert gas) that carries the liquid droplets.

Also, with the third embodiment, the case where a processing liquid is discharged from one of the nozzles throughout the processing of the substrate W by the processing liquid was described. However, the substrate W may instead be processed by making a liquid film of the processing liquid be held on the substrate W. That is, a puddle processing may be performed in which the liquid film of the processing liquid is held on the substrate to make the processing progress while stopping the supply of the processing liquid to the substrate W.

Specifically, a processing liquid is discharged from one of the nozzles while making the substrate W rotate at a low rotation speed of about 10 to 30 rpm by the spin chuck 302 or while stopping the rotation of the substrate W. The discharge of the processing liquid is then stopped after the liquid film of the processing liquid that covers the upper surface of the substrate W is formed. Thereafter, the substrate W is rotated at the low rotation speed or the rotation of the substrate W is stopped in the state where the discharge of the processing liquid is stopped. The substrate W is thereby processed in the state where the liquid film of the processing liquid is held on the substrate W.

Also, with the third embodiment, the case where the hydrophobization processing (hydrophobizing agent supply step), the fourth solvent rinsing processing (drying agent supply step), and the drying processing (drying step) are performed successively was described. However, the hydrophobizing agent may be supplied to the substrate W again after performing the hydrophobization processing and before performing the fourth solvent rinsing processing. That is, the hydrophobization processing may be performed a plurality of times. In this case, the hydrophobizing agent used in the hydrophobization processing (first hydrophobizing agent supply step) that is performed first and the hydrophobizing agent (second hydrophobizing agent) used in the hydrophobization processing (second hydrophobizing agent supply step) performed next may be metal hydrophobizing agents of the same type or may be metal hydrophobizing agents (second hydrophobizing agents) of different types. Also, one of the first hydrophobizing agent and the second hydrophobizing agent may be a metal hydrophobizing agent and the other may be a silicon hydrophobizing agent.

A silicon hydrophobizing agent is a hydrophobizing agent that hydrophobizes silicon (Si) itself or a compound that contains silicon. The silicon hydrophobizing agent is, for example, a silane coupling agent. The silane coupling agent contains, for example, at least one of HMDS (hexamethyldisilazane), TMS (tetramethylsilane), a fluorinated alkylchlorosilane, an alkyldisilazane, and a nonchloro hydrophobizing agent. The nonchloro hydrophobizing agent contains, for example, at least one of dimethylsilyldimethylamine, dimethylsilyldiethylamine, hexamethyldisilazane, tetramethyldisilazane, bis(dimethylamino)dimethylsilane, N,N-dimethylaminotrimethylsilane, N-(trimethylsilyl)dimethylamine, and an organosilane compound.

Figure 30:
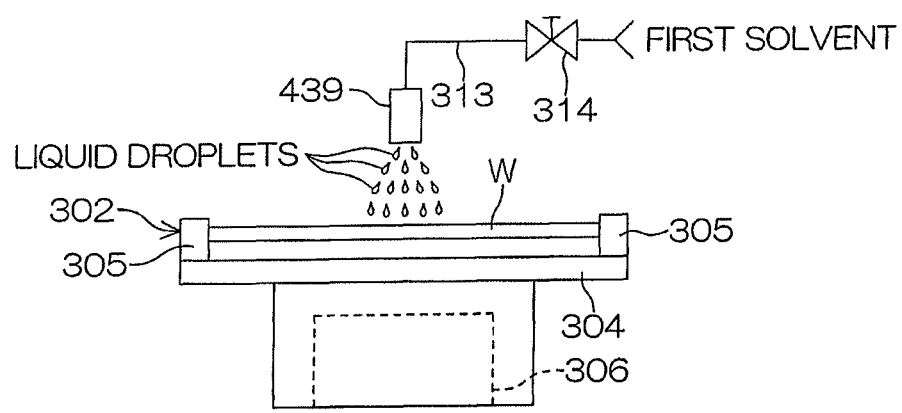
FIG. 30 is a schematic view of a liquid droplet forming nozzle according to a fourth embodiment of the present invention.

Also, with the third embodiment, the case where the first solvent, to which vibration is applied, is discharged from the solvent nozzle 312 as an ultrasonic nozzle was described. However, a liquid droplet forming nozzle 439 (liquid droplet forming unit) shown in FIG. 30 may be provided in place of the ultrasonic nozzle. The liquid droplet forming nozzle 439 is a nozzle that forms liquid droplets of the first solvent that are blown onto the substrate W held by the spin chuck 302. Thus, by causing the first solvent to be discharged from the liquid droplet forming nozzle 439, the liquid droplets of the first solvent collide with the substrate W (step of making liquid droplets of the first solvent collide with the substrate), and the rinsing liquid held by the substrate is removed by kinetic energy of the liquid droplets. The liquid droplet forming nozzle 439 may be a two-fluid nozzle that forms liquid droplets of the first solvent by making the liquid of the first solvent collide with a gas, or an inkjet nozzle that jets liquid droplets of the first solvent by application of vibration to the first solvent by a piezoelectric element. In a case where the liquid droplet forming nozzle 439 is provided in place of the ultrasonic nozzle, the ultrasonic transducer 315 may be mounted to the liquid droplet forming nozzle 439 and vibration may be applied to the liquid droplets of the first solvent that are jetted toward the substrate W.

Also, with the third embodiment, the case where the hydrophobizing agent that has been diluted to a fixed concentration by the second solvent is supplied to the substrate W was described. However, an undiluted hydrophobizing agent (hydrophobizing agent stock solution) may be supplied to the substrate W instead. Or, when the hydrophobizing agent is being supplied to the substrate W, the controller 327 may control the opening degrees of the first flow regulating valve 334 and/or the second flow regulating valve 337 to increase the concentration of the hydrophobizing agent in a continuous or a stepwise manner.

Also, with the third embodiment, the case where the hydrophobizing agent stock solution and the second solvent are mixed in the collective pipe 338 was described. However, the mixing of the hydrophobizing agent stock solution and the second solvent is not restricted to the collective pipe 338 and may be performed at any position of the flow path of the hydrophobizing agent leading from the hydrophobizing agent tank 328 to the substrate W held by the spin chuck 302. Specifically, the hydrophobizing agent stock solution and the second solvent may be mixed at any of the first pipe 330, the processing liquid supply pipe 317, and the central axis nozzle 316. Further, the hydrophobizing agent stock solution and the second solvent may be mixed in between the central axis nozzle 316 and the substrate W or may be mixed on the substrate W.

Also, with the third embodiment, the case of drying the substrate W by removing the liquid from the substrate W by making the substrate W rotate at a high rotation speed by the driving force of the spin motor 306 was described. However, a gas nozzle that blows a gas, such as nitrogen gas or other inert gas or clean air, etc., onto the substrate W may be provided and the substrate W may be dried by removal of the liquid from the substrate W by the gas discharged from the gas nozzle.

Also, with the third embodiment, the case where the hydrophobizing agent, the water-soluble solvent, the drying agent, and the rinsing liquid are discharged from a nozzle in common (central axis nozzle 316) was described. However, the hydrophobizing agent, the water-soluble solvent, the drying agent, and the rinsing liquid may be discharged respectively from dedicated nozzles instead.

While the embodiments of the present invention have been described in detail above, these are merely specific examples used for clarifying the technical contents of the present invention, and the present invention should not be interpreted as being restricted to these specific examples, and the spirit and scope of the present invention are limited solely by the appended claims.

The present application corresponds to Japanese Patent Application No. 2010-185415 filed in the Japan Patent Office on Aug. 20, 2010, Japanese Patent Application No. 2011-071590 filed in the Japan Patent Office on Mar. 29, 2011, and Japanese Patent Application No. 2011-099529 filed in the Japan Patent Office on Apr. 27, 2011, and the entire disclosures of the applications are incorporated herein by reference.

What is claimed is:

1. A substrate processing method comprising:
   a water rinsing step of supplying a rinsing liquid that contains water to a substrate; followed by
   a first solvent rinsing step of supplying a solvent to the substrate; followed by
   a hydrophobizing step of hydrophobizing a surface of the substrate by supplying a vapor of a hydrophobizing agent to the substrate including a pattern formed on the surface of the substrate;
   wherein the solvent supplied to the substrate in the first solvent rinsing step is a solvent that is capable of dissolving the rinsing liquid and the hydrophobizing agent and lower in surface tension than water;
   a drying step of drying the substrate by vaporizing the hydrophobizing agent adhering to the substrate, after performing the hydrophobizing step; and a step of maintaining the substrate in a state of not contacting water from an end of the hydrophobizing step to an end of the drying step.

2. The substrate processing method according to claim 1, wherein the hydrophobizing step is a step of hydrophobizing the surface, that includes an internal portion of the pattern, of the substrate by supplying the vapor of the hydrophobizing agent to the substrate.

3. The substrate processing method according to claim 1, wherein the substrate includes a metal film.

* * * * *